US011409335B2

(12) United States Patent
Jeong

(10) Patent No.: US 11,409,335 B2
(45) Date of Patent: Aug. 9, 2022

(54) DISPLAY DEVICE

(71) Applicant: Samsung Display Co., Ltd., Yongin-si (KR)

(72) Inventor: Young Cheol Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 396 days.

(21) Appl. No.: 16/729,561

(22) Filed: Dec. 30, 2019

(65) Prior Publication Data

US 2020/0249728 A1 Aug. 6, 2020

(30) Foreign Application Priority Data

Jan. 31, 2019 (KR) .................. 10-2019-0012835

(51) Int. Cl.
| | | |
|---|---|---|
| *G06F 1/16* | (2006.01) | |
| *G02F 1/1345* | (2006.01) | |
| *H01L 27/32* | (2006.01) | |

(52) U.S. Cl.
CPC ........ *G06F 1/1683* (2013.01); *G02F 1/13452* (2013.01); *H01L 27/3276* (2013.01)

(58) Field of Classification Search
CPC ........... G02F 1/133305; G02F 1/13452; G06F 1/1652; G09F 9/301
See application file for complete search history.

(56) References Cited

U.S. PATENT DOCUMENTS

| | | | | |
|---|---|---|---|---|
| 6,677,664 B2* | 1/2004 | Inoue | ................ | H05K 7/20963 |
| | | | | 257/668 |
| 7,034,220 B2* | 4/2006 | Kim | ................... | H05K 9/0096 |
| | | | | 174/385 |
| 7,372,704 B2* | 5/2008 | Jeong | ..................... | H05K 5/02 |
| | | | | 348/836 |
| 7,481,567 B2* | 1/2009 | Cho | ..................... | G02B 6/0085 |
| | | | | 362/561 |
| 7,586,744 B2* | 9/2009 | Okuda | ............. | G02F 1/133308 |
| | | | | 361/679.56 |
| 9,329,447 B2 | 5/2016 | Jung et al. | | |
| 9,433,087 B2* | 8/2016 | Tashiro | ................ | H05K 1/0306 |
| 9,622,391 B2* | 4/2017 | Lee | .......... | G06F 1/203 |
| 9,933,644 B2 | 4/2018 | Kim et al. | | |
| 10,101,618 B2* | 10/2018 | Abe | ................. | G02F 1/136227 |
| 10,271,425 B1* | 4/2019 | Hassemer | ............ | G06F 1/1656 |
| 10,459,269 B2* | 10/2019 | Shin | .................... | G02F 1/13452 |
| 10,949,008 B2* | 3/2021 | Ryu | ..................... | G06F 3/0412 |
| 2004/0135936 A1* | 7/2004 | Lee | .................... | G02B 6/0076 |
| | | | | 349/64 |

(Continued)

*Primary Examiner* — Adrian S Wilson
(74) *Attorney, Agent, or Firm* — H.C. Park & Associates, PLC

(57) ABSTRACT

A display device including a display panel having a plurality of signal wirings disposed on a side surface, each of the signal wirings including a first surface and a second surface different from the first surface; and a printed circuit board attached to the side surface of the display panel and including a base film and a plurality of lead wirings disposed on one surface of the base film. Each of the lead wirings includes a first lead portion and a second lead portion having a thickness less than that of the first lead portion. The first lead portion is bonded to the second surface, and the second lead portion is bonded to the first surface.

21 Claims, 27 Drawing Sheets

(56) References Cited

U.S. PATENT DOCUMENTS

| | | | |
|---|---|---|---|
| 2005/0083646 A1* | 4/2005 | Bae | H05K 7/20963 |
| | | | 361/736 |
| 2013/0271425 A1* | 10/2013 | Kurashima | G06F 3/041 |
| | | | 345/174 |
| 2016/0218079 A1* | 7/2016 | Gong | G02F 1/13452 |
| 2017/0006738 A1* | 1/2017 | Lee | G02F 1/13452 |
| 2017/0068139 A1* | 3/2017 | Takabayashi | G02F 1/133308 |
| 2017/0082888 A1* | 3/2017 | Park | G02F 1/13452 |
| 2017/0092663 A1* | 3/2017 | Chung | H05K 1/148 |
| 2018/0068940 A1* | 3/2018 | Oh | H01L 25/18 |
| 2019/0235337 A1* | 8/2019 | McCartney | G02F 1/13336 |
| 2019/0244978 A1* | 8/2019 | Yoshioka | H01L 21/50 |
| 2019/0259824 A1* | 8/2019 | Cho | G02F 1/136286 |
| 2019/0339578 A1* | 11/2019 | Takabayashi | G02F 1/133528 |
| 2019/0361281 A1* | 11/2019 | Lu | G02F 1/13338 |
| 2020/0209926 A1* | 7/2020 | Jeong | G06F 1/1637 |
| 2020/0212160 A1* | 7/2020 | Jeong | H01L 27/3276 |

\* cited by examiner

DISPLAY DEVICE

CROSS-REFERENCE TO RELATED APPLICATION

This application claims priority from and the benefit of Korean Patent Application No. 10-2019-0012835 filed on Jan. 31, 2019, which is hereby incorporated by reference for all purposes as if fully set forth herein.

BACKGROUND

Field

Exemplary embodiments/implementations of the invention relate generally to a display device.

Discussion of the Background

A display device is a device for displaying moving images or still images. The display device may be used as a display screen of various products such as a television, a laptop computer, a monitor, a billboard, and an Internet of Things device as well as a portable electronic device such as a mobile phone, a smart phone, a tablet personal computer (PC), a smart watch, a watch phone, a mobile communication terminal, an electronic notebook, an electronic book, a portable multimedia player (PMP), a navigation device, and an ultra-mobile PC (UMPC).

The display device may be, for example, an organic light emitting display device. The image display of the display device such as the organic light emitting display device is caused by the transmission of light. In particular, the transmittance of light may affect the display quality such as the luminance of the display device. Thus, the constituent elements of the display device may at least partially include a transparent member, for example, a glass member.

Meanwhile, in order to drive light emitting elements of the display device, a printed circuit board is usually required, which includes a driving circuit, a plurality of signal wirings for electrically connecting the light emitting elements, and a plurality of lead wirings connected to the plurality of signal wirings. The display device includes a display area in which an image is displayed and a portion, i.e., a bezel, surrounding the display area, in which an image is not displayed. In order to implement a bezel-less display, the signal wirings and the lead wirings may be side-bonded on the side surface of the display device.

However, connection reliability between the signal wirings and the lead wirings may deteriorate depending on the driving environment of the display device. When the connection reliability deteriorates as described above, it may lead to a driving failure of the display device. Therefore, studies are being conducted to prevent a short circuit between connection wirings.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device with improved bonding between signal wirings of a display panel and lead wirings of a printed circuit board.

Additional features of the inventive concepts will be set forth in the description which follows, and in part will be apparent from the description, or may be learned by practice of the inventive concepts.

According to an exemplary embodiment of the inventive concepts, it is possible to provide a display device with improved bonding between signal wirings of a display panel and lead wirings of a printed circuit board.

The effects of the inventive concepts are not limited to the aforementioned effects, and various other effects are included in the present specification.

According to an exemplary embodiment of the inventive concepts, a display device includes a display panel including a plurality of signal wirings disposed on a side surface, each of the signal wirings including a first surface and a second surface different from the first surface; and a printed circuit board attached to the side surface of the display panel and including a base film and a plurality of lead wirings disposed on one surface of the base film, wherein each of the lead wirings includes a first lead portion and a second lead portion having a thickness smaller than the first lead portion, and wherein the first lead portion is bonded to the second surface, and the second lead portion is bonded to the first surface.

The display panel may include a first substrate and a second substrate facing the first substrate, wherein the signal wirings are disposed over a side surface of the first substrate and a side surface of the second substrate, and wherein the signal wiring includes a third surface bonded to the side surface of the first substrate and the side surface of the second substrate, and the first surface is opposite to the third surface.

The second lead portion may include a first surface facing the one surface of the base film and a second surface opposite to the first surface, and wherein the first surface of the signal wiring is in contact with the second surface of the second lead portion.

The second surface of the signal wiring may be disposed on the side surface of the second substrate and faces the second substrate from the first substrate, and wherein the second surface of the signal wiring is in contact with the first lead portion.

The first lead portion may include a third surface facing the first substrate from the second substrate and the third surface of the first lead portion is in contact with the second surface of the signal wiring.

The second surface of the signal wiring may be disposed on the side surface of the first substrate and face the first substrate from the second substrate, and the second surface of the signal wiring may be in contact with the first lead portion.

The first lead portion may include a third surface facing the second substrate from the first substrate, and the third surface of the first lead portion may be in contact with the second surface of the signal wiring.

The lead wiring may further include a third lead portion having a thickness larger than the second lead portion and separated from the first lead portion with the second lead portion interposed therebetween, wherein the second surface of the signal wiring is disposed on the side surface of the second substrate and faces the second substrate from the first substrate, and wherein the signal wiring further includes a fourth surface which is disposed on the side surface of the first substrate, faces the first substrate from the second substrate and is opposite to the second surface.

The second surface of the signal wiring may be in contact with the first lead portion, and the fourth surface of the signal wiring may be in contact with the third lead portion.

The first lead portion may include a third surface facing the first substrate from the second substrate, the third surface of the first lead portion may be in contact with the second surface of the signal wiring, the third lead portion may include a fourth surface facing the second substrate from the first substrate, and the fourth surface of the third lead portion may be in contact with the fourth surface of the signal wiring.

In one of the lead wirings, the first lead portion may be disposed on one side of the second lead portion in a side surface extending direction of the display panel.

In one of the lead wirings, the first lead portion may be further disposed on the other side opposite to the one side of the second lead portion in the side surface extending direction of the display panel.

The first lead portion may be disposed on one side of the second lead portion in a direction to the first substrate from the second substrate and on the other side opposite to the one side of the second lead portion, the second lead portion may include a lead groove surrounded by the first lead portion in a plan view, and the signal wiring may be received in the lead groove.

The display panel may include a first substrate and a second substrate facing the first substrate, the signal wirings may be disposed over a side surface of the first substrate and a side surface of the second substrate, and the signal wiring may include a first signal wiring pattern and a second signal wiring pattern having a thickness smaller than the first signal wiring pattern.

The first signal wiring pattern may be in contact with the first lead portion and the second lead portion, and the second signal wiring pattern may be in contact with the first lead portion.

The lead wiring may further include a third lead portion having a thickness larger than the second lead portion and separated from the first lead portion with the second lead portion interposed therebetween, and the signal wiring may further include a third signal wiring pattern having a thickness smaller than the second signal wiring pattern and separated from the second signal wiring pattern with the first signal wiring pattern interposed therebetween.

The first signal wiring pattern may be in contact with the first lead portion and the third lead portion, and the third signal wiring pattern may in contact with the third lead portion.

The signal wiring may further include a third signal wiring pattern having a thickness larger than the second signal wiring pattern and separated from the first signal wiring pattern with the second signal wiring pattern interposed therebetween, the first signal wiring pattern may be in contact with the first lead portion and the second lead portion, the second signal wiring pattern may be in contact with the first lead portion, and the third signal wiring pattern may be in contact with the first lead portion and the second lead portion.

According to another exemplary embodiment of the inventive concepts, a display device includes a display panel including a plurality of signal wirings disposed on a side surface, each of the signal wirings including a first surface and a second surface different from the first surface; and a printed circuit board attached to the side surface of the display panel and including a base film and a plurality of lead wirings disposed on the base film, wherein each of the lead wirings includes a first region where a main lead portion is disposed on one surface of the printed circuit board facing the side surface of the display panel, and a second region where the main lead portion and a protruding lead portion protruding from the main lead portion are disposed to overlap each other, wherein the first region of the lead wiring is bonded to the first surface of the signal wiring, and wherein the second region of the lead wiring is bonded to the second surface of the signal wiring.

The display panel may include a display substrate and an encapsulating substrate facing the display substrate, and the signal wirings may be disposed over a side surface of the display substrate and a side surface of the encapsulating substrate.

According to another exemplary embodiment of the inventive concepts, a display device includes a display panel including substrate and a signal wiring disposed on a side surface of the substrate, the signal wiring including a first surface contacting to the side surface of the substrate and a second surface facing the first surface and a third surface connected with the first surface and the second surface; and a printed circuit including a film and a lead wiring disposed on one surface of the film, wherein a lead wiring includes a first lead portion and a second lead portion having a thickness smaller than the first lead portion, and the first lead portion is contacted to the second surface of the signal wiring, and the second lead portion is contacted to the third surface of the signal wiring.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
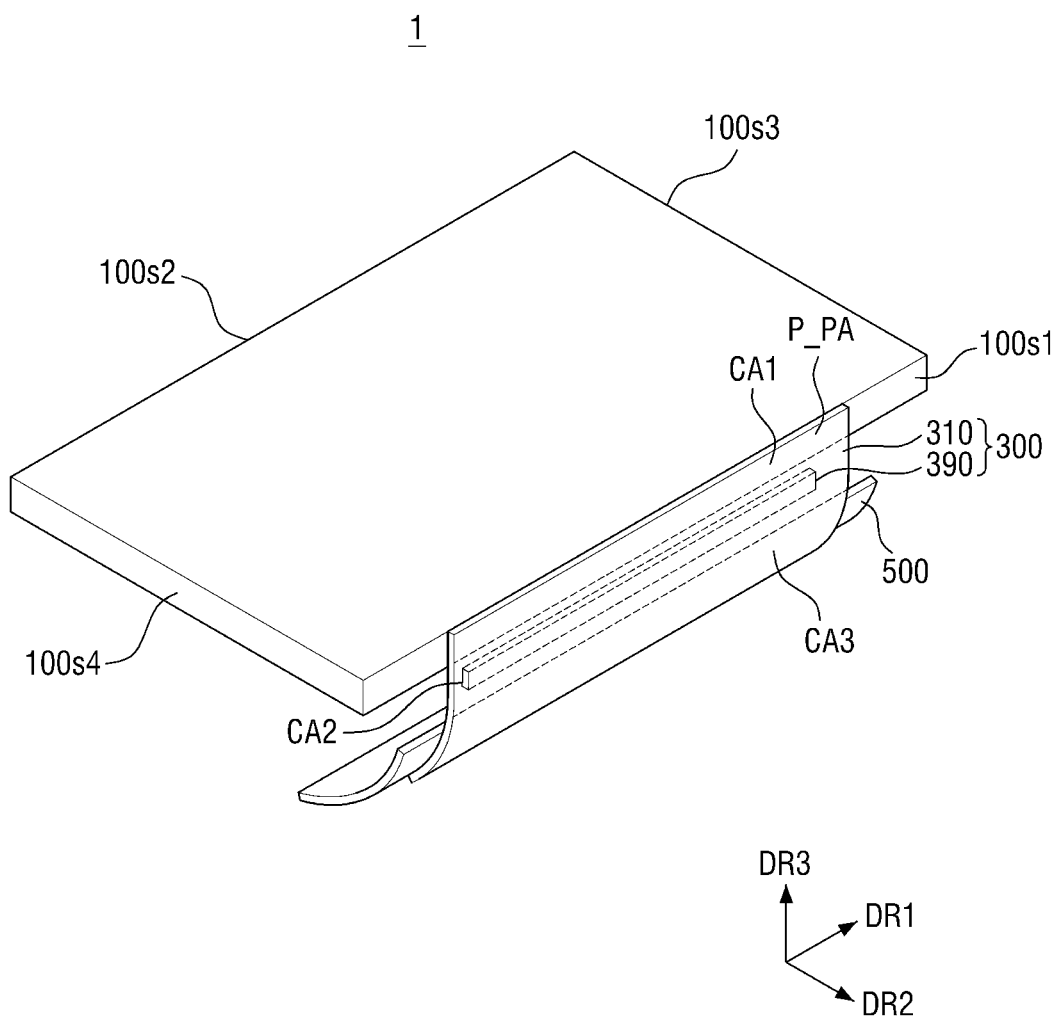
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
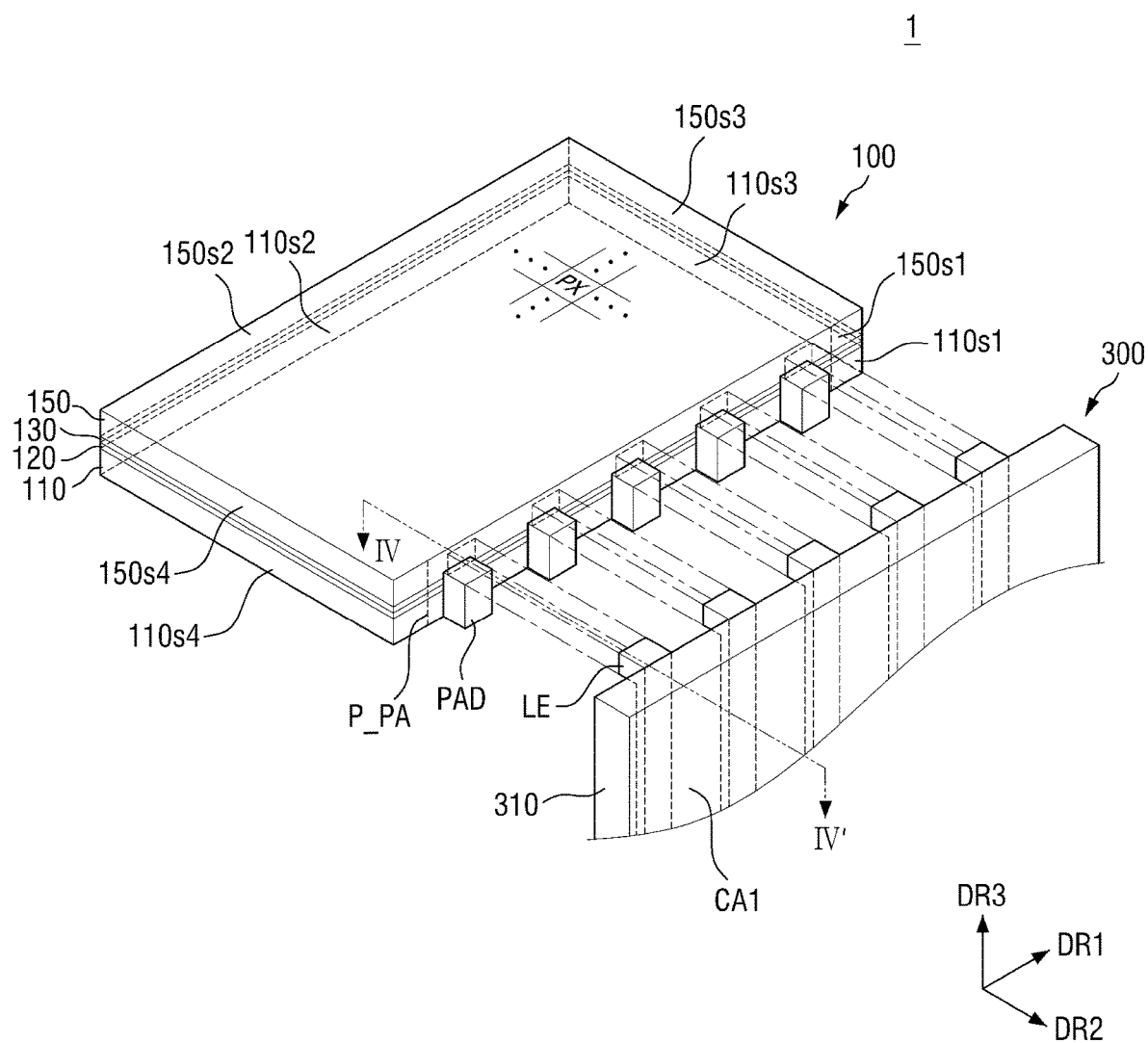
FIG. 2 is an exploded perspective view of the display device of FIG. 1.
Figure 3:
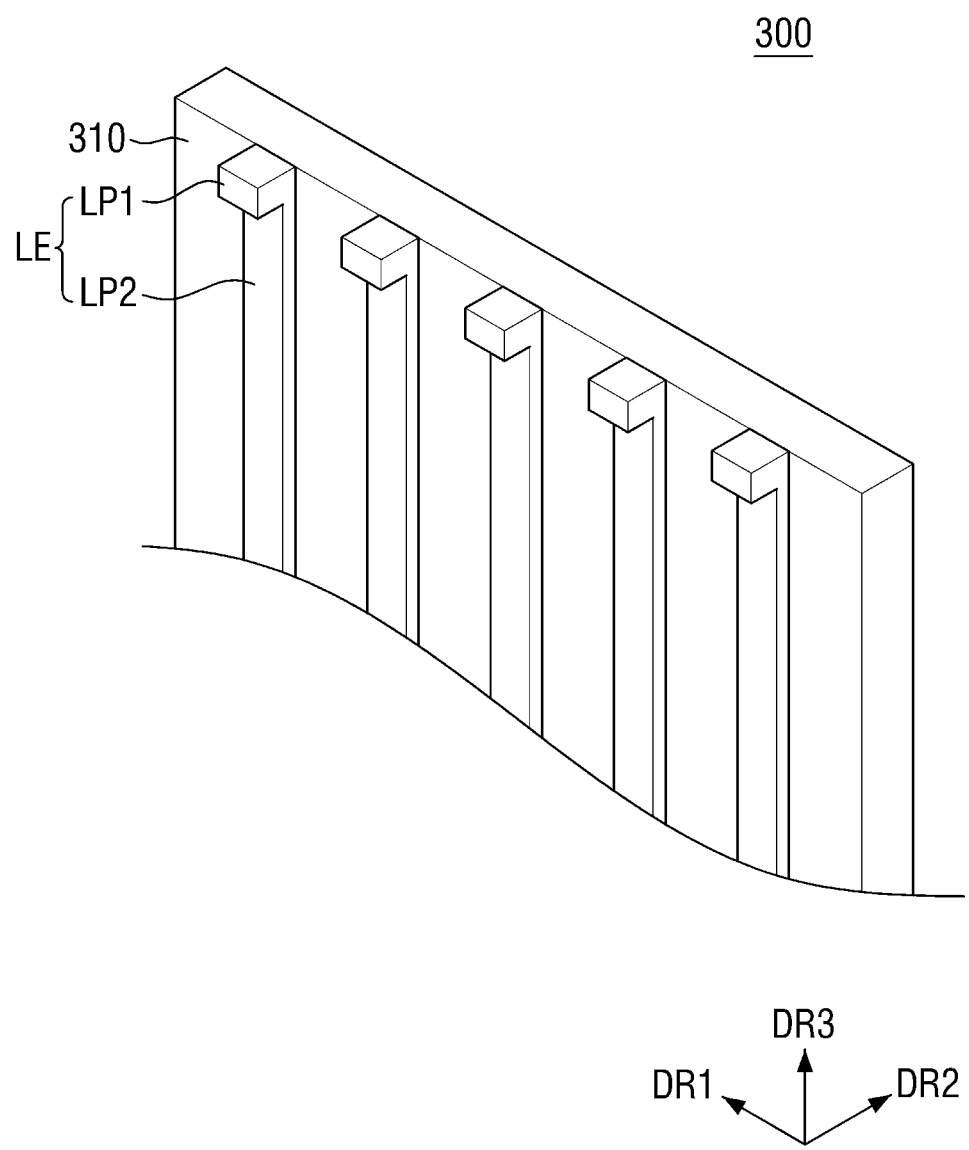
FIG. 3 is a perspective view of a first circuit board according to an exemplary embodiment.
Figure 4:
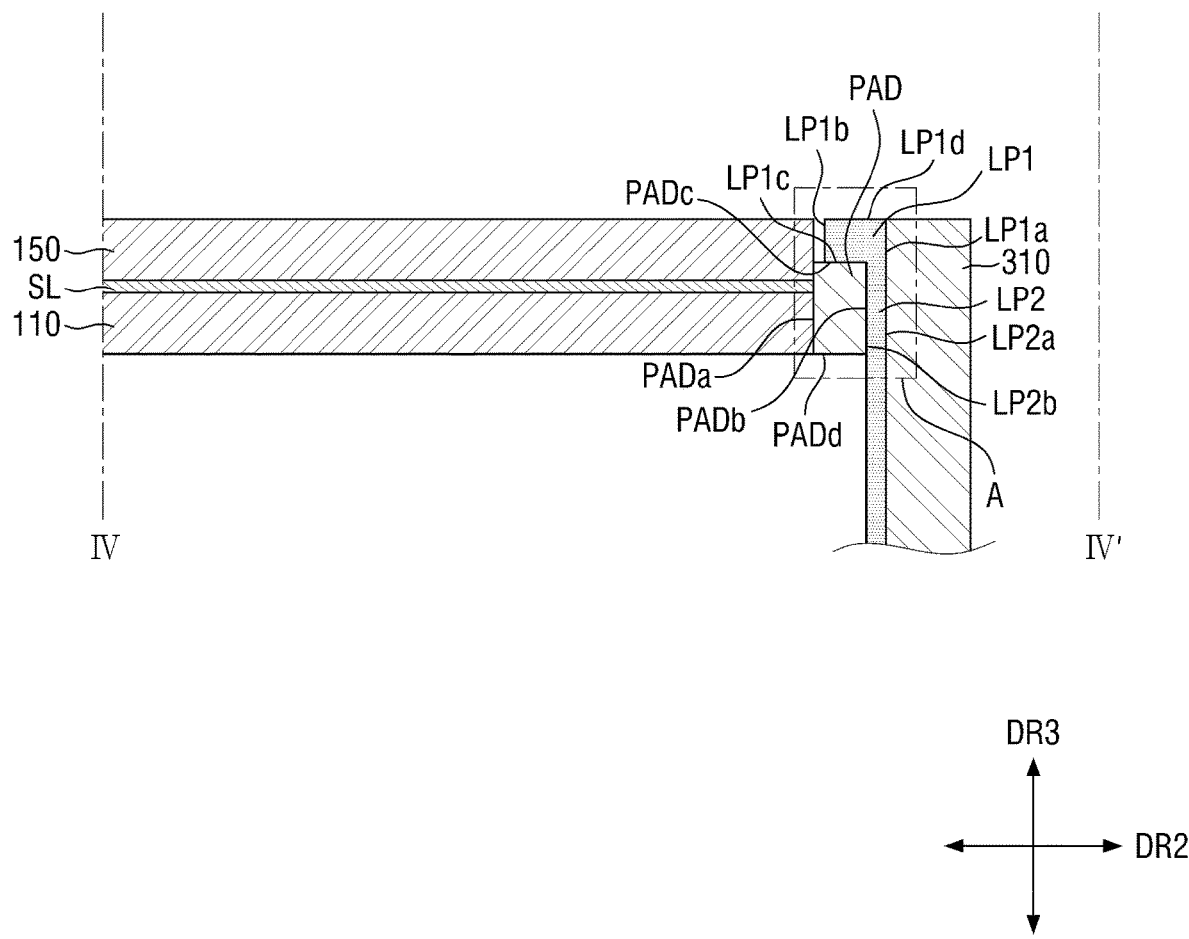
FIG. 4 is a cross-sectional view taken along sectional line IV-IV' of FIG. 2.
Figure 5:
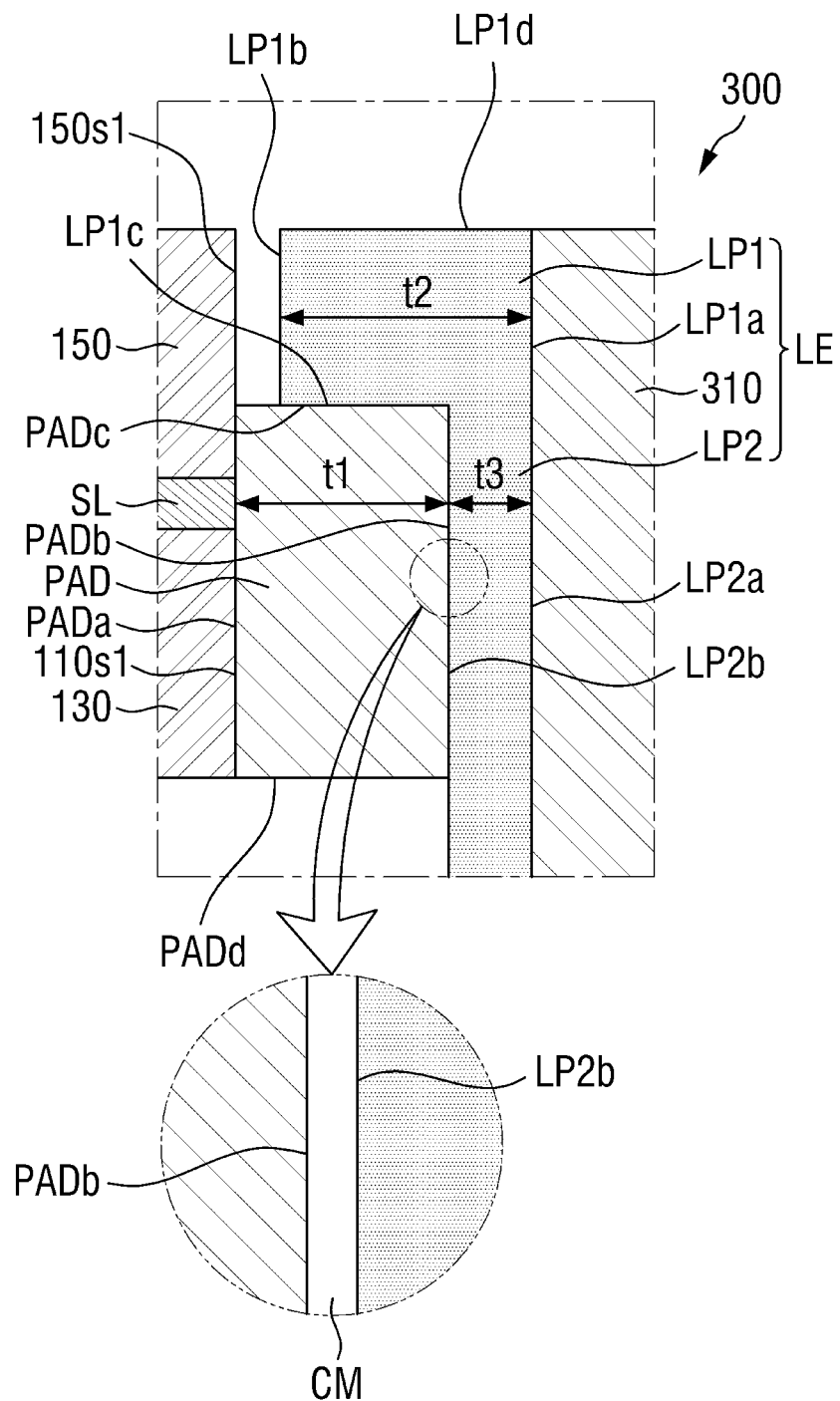
FIG. 5 is an enlarged view of region A of FIG. 4.
Figure 6:
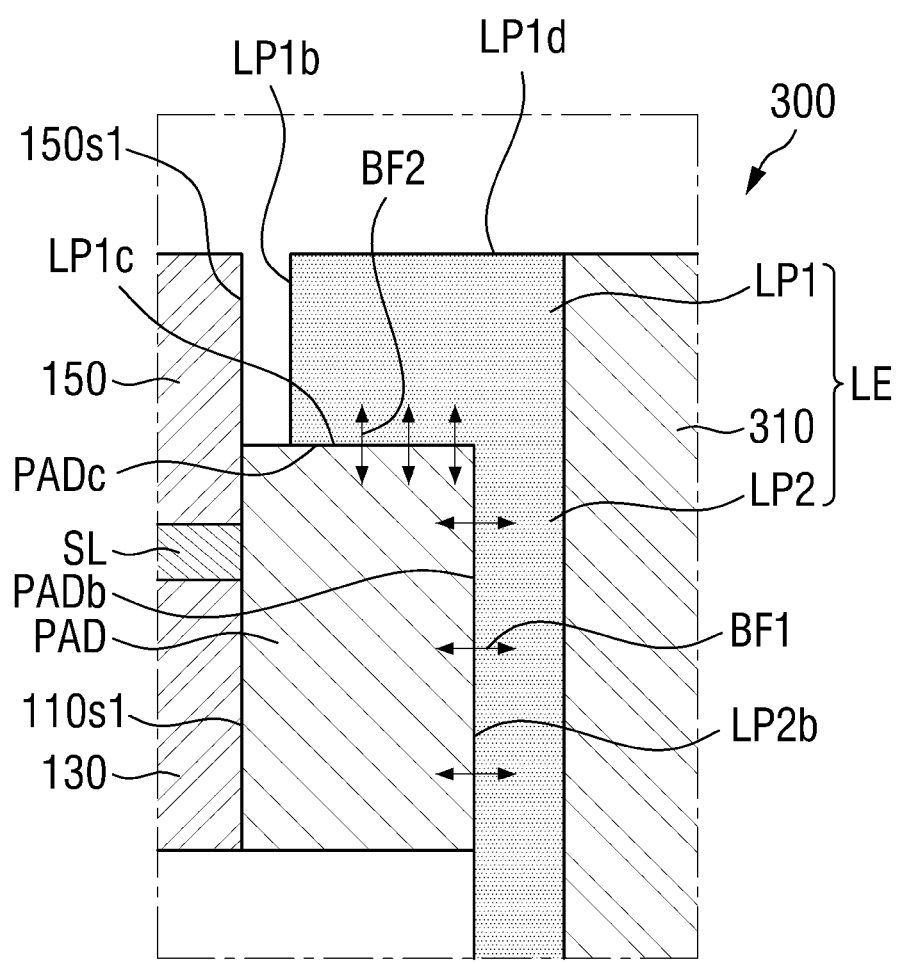
FIG. 6 is a diagram showing a bonding force between signal wiring and lead wiring.

FIG. 1 is a perspective view of a display device according to an exemplary embodiment, and FIG. 2 is an exploded perspective view of the display device of FIG. 1. FIG. 3 is a perspective view of a first circuit board according to an exemplary embodiment, and FIG. 4 is a cross-sectional view taken along sectional line IV-IV' of FIG. 2. FIG. 5 is an enlarged view of region A of FIG. 4, and FIG. 6 is a diagram showing a bonding force between signal wiring and lead wiring.

A display device 1 is a device for displaying moving images or still images. The display device may be used as a display screen of various products such as a television, a laptop computer, a monitor, a billboard, and the Internet of Things as well as a portable electronic device such as a mobile phone, a smart phone, a tablet personal computer (PC), a smart watch, a watch phone, a mobile communication terminal, an electronic notebook, an electronic book, a portable multimedia player (PMP), a navigation device, and an ultra-mobile PC (UMPC).

Referring to FIGS. 1, 2, 3, 4, 5, and 6, the display device 1 may include a display panel 100 for displaying an image, a first circuit board 300 connected to the display panel 100 and a second circuit board 500 connected to the first circuit board 300.

The display panel 100 may be, for example, an organic light emitting display panel. In the following exemplary embodiments, a case where an organic light emitting display panel is applied to the display panel 100 will be described as an example, but the inventive concepts are not limited thereto. For example, other types of display panels, such as a liquid crystal display (LCD) panel, a quantum dot organic light emitting display (QD-OLED) panel, a quantum dot liquid crystal display (QD-LCD) panel, a quantum nano light emitting display (QNED) panel, and a micro LED panel, may be applied to the display panel 100.

The display panel 100 includes a plurality of pixels PX. The plurality of pixels PX may include a circuit driving layer 120 and an organic light emitting element layer 130, which will be described later. The plurality of pixels PX are separated from each other. The circuit driving layer 120 and the organic light emitting element layer 130 included in each pixel PX may be disposed for each of the pixels PX that are separated from each other.

The display panel 100 may have a polygonal columnar shape, as shown in FIG. 1. The display panel 100 may have, for example, a rectangular parallelepiped shape.

The planar shape of the display panel 100 may be a rectangular shape having vertical edges in a plan view. The display panel 100 may have short sides and long sides in a plan view. The short side of the display panel 100 may extend in a second direction DR2 and the long side of the display panel 100 may extend in a first direction DR1. However, the planar shape of the display panel 100 is not limited to a rectangular shape, but may have various other shapes such as a circular shape or an elliptical shape. Although not shown, the display panel 100 may include a display area which is located at the center and displays an image, and a non-display area which is located around the display area. The non-display area of the display panel 100 may be a bezel.

The display panel 100 includes side surfaces located at both long sides and both short sides as described above. The display panel 100 may include, for example, a first side surface 100s1 at which the first long side is located and to which the first circuit board 300 is attached, a second side surface 100s2 at which the second long side opposite to the first long side is located, a third side surface 100s3 at which the first short side is located, and a fourth side surface 100s4 at which the second short side is located and which is opposite to the third side surface. The side profiles of the display panel 100 may include side profiles of a lower substrate, an upper substrate, the circuit driving layer, and the organic light emitting element layer of the display panel 100 to be described later.

The first side surface 100s1 of the display panel 100 may include a panel pad area P_PA. The first circuit board 300 may be attached to the panel pad area P_PA. Although FIG. 1 illustrates the case where the panel pad area P_PA is located only on the first side surface 100s1 of the display panel 100, the inventive concepts are not limited thereto. The panel pad area P_PA may be located on the second side surface 100s2 or on both the first side surface 100s1 and the second side surface 100s2 of the display panel 100. Alternatively, the panel pad area P_PA may be located on the third side surface 100s3 and/or the fourth side surface 100s4 of the display panel 100.

The first circuit board 300 may be attached to the panel pad area P_PA of the display panel 100. The first circuit board 300 may include a base film 310 and a driving integrated circuit 390 disposed on the base film 310. The base film 310 may include a flexible insulating material. The first circuit board 300 may be a flexible printed circuit board.

The first circuit board 300 may include a first circuit area CA1 attached to the panel pad area P_PA of the display panel 100, a third circuit area CA3 to which the second circuit board 500 is attached, and a second circuit area CA2 disposed between the first circuit area CA1 and the third circuit area CA3. The driving integrated circuit 390 may be disposed on one surface of the second circuit area CA2 of the first circuit board 300. Although FIG. 1 illustrates a case where the first circuit area CA1 of the one surface of the first circuit board 300, on which the driving integrated circuit 390 is disposed, is attached to the display panel 100, the inventive concepts are not limited thereto. The other surface of the first circuit board 300 opposite to the one surface may be attached to the display panel 100.

The driving integrated circuit 390 may be, for example, a data driving integrated circuit, and a chip on film (COF) method implemented by a data driving chip may be applied thereto.

The second circuit board 500 may include a circuit pad area attached to the third circuit area CA3 of the first circuit board 300. A plurality of circuit pads may be disposed in the circuit pad area of the second circuit board 500 and the plurality of circuit pads may be attached to the third circuit area CA3 of the first circuit board 300.

Although not shown, the display device 1 may include a panel lower sheet disposed at a lower portion of the display panel 100, a touch electrode portion disposed on the upper substrate 150 of the display panel 100, which will be described later, and a window disposed on the touch electrode portion.

Unless otherwise defined, the terms "upper portion," "top" and "upper surface" as used herein refer to a display surface side with respect to the display panel 100, and the terms "lower portion," "bottom" and "lower surface" as used herein refer to an opposite side of the display surface with respect to the display panel 100.

The panel lower sheet includes at least one functional layer. The functional layer may be a layer that performs a heat dissipation function, an electromagnetic wave shielding function, a grounding function, a buffering function, a rigidity enhancing function, a supporting function, and/or a digitizing function.

The touch electrode portion may be formed directly on one surface of the upper substrate 150. In some exemplary embodiments, the touch electrode portion may be in the form of a touch member and be disposed on the upper substrate 150. The touch member may be a touch film or a touch panel, but is not limited thereto.

The window may be a cover window covering the display panel 100, the touch electrode portion, and the panel lower sheet which are disposed therebelow. Examples of materials applicable to the window may include glass, quartz, plastic, and the like.

The first circuit board 300 and the second circuit board 500 may be bent downward in a third direction DR3 as shown in FIG. 1. That is, the one surface of the first circuit board 300 may be bent to the lower side of the display panel 100, facing the first side surface 100s1 and the rear surface of the display panel 100. In this case, the first circuit board 300 and the second circuit board 500 may be disposed on the lower surface of the panel lower sheet.

Referring to FIG. 2, the display panel 100 may include a lower substrate 110, an upper substrate 150 facing the lower substrate 110, the circuit driving layer 120 disposed between the lower substrate 110 and the upper substrate 150, the organic light emitting element layer 130 disposed between the circuit driving layer 120 and the upper substrate 150, and a plurality of signal wirings PAD disposed on the side surfaces of the lower substrate 110 and the upper substrate 150.

The lower substrate 110 may be a display substrate for supporting the circuit driving layer 120 and the organic light emitting element layer 130. The planar shape of the lower substrate 110 may be a rectangle having vertical edges. The lower substrate 110 may be a rigid substrate including a rigid material such as glass and quartz in one exemplary embodiment. However, without being limited thereto, the display substrate 101 may be a flexible substrate including a flexible material such as polyimide (PI).

The lower substrate 110 includes side surfaces 110s1 to 110s4 located on the side surfaces 100s1 to 100s4 in the display panel 100. The panel pad area P_PA may be located on the first side surface 110s1 of the lower substrate 110.

In one exemplary embodiment, the upper substrate 150 may be an encapsulating substrate that covers the organic light emitting element layer 130. The upper substrate 150 may include at least one material selected from the above-mentioned materials of the lower substrate 110. The planar shape of the upper substrate 150 may be substantially the same as the planar shape of the lower substrate 110 described above. At least one side surface of the upper substrate 150 may be recessed inwardly from a corresponding side surface of the lower substrate 110 in a thickness direction.

The upper substrate 150 includes side surfaces 150s1 to 150s4 located on the side surfaces 100s1 to 100s4 in the display panel 100, similarly to the lower substrate 110. The side surfaces 150s1 to 150s4 of the upper substrate 150 may be substantially aligned with the side surfaces 110s1 to 110s4 of the lower substrate 110 in the thickness direction. The panel pad area P_PA may be located on the first side surface 150s1 of the upper substrate 150.

Meanwhile, the display panel 100 may further include a sealing region where the upper substrate 150 and the lower substrate 110 are bonded to each other. The sealing region may be located along the edges of the upper substrate 150 and the lower substrate 110, or along the edge regions. That is, the sealing region may be formed in a rectangular frame shape along the side surfaces of the upper substrate 150 and the side surfaces of the lower substrate 110, but the inventive concepts are not limited thereto.

The circuit driving layer 120 may be disposed on the lower substrate 110, and may include elements for providing a signal to the organic light emitting element layer 130. The circuit driving layer 120 may include various signal lines, e.g., a scan line, a data line, a power line and a light emitting line. The circuit driving layer 120 may include a plurality of transistors and capacitors. The transistors may include a switching transistor and a driving transistor Qd provided for each pixel.

The circuit driving layer 120 may further include a connection signal line SL disposed on the lower substrate 110 as shown in FIG. 4. The connection signal line SL may be electrically connected to the signal wirings PAD. The connection signal line SL may electrically connect the pixels PX of the display panel 100. The connection signal line SL may be disposed over the panel pad area P_PA and the pixels PX of the display panel 100. The connection signal line SL may be a gate conductive layer in which a plurality of scan lines and/or gate electrodes of the pixels PX are arranged or a source/drain conductive layer in which a plurality of data lines of the pixels PX are arranged, but the inventive concepts are not limited thereto.

The connection signal line SL may be formed of at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The organic light emitting element layer 130 may be disposed on the circuit driving layer 120. Light generated in the organic light emitting element layer 130 may be emitted to the outside through the display surface. For example, the light generated in the organic light emitting element layer 130 may be emitted upward, for example, in the third direction DR3.

A plurality of signal wirings PAD may be arranged in the panel pad area P_PA. The plurality of signal wirings PAD may be electrically connected to the connection signal line SL and connected to a lead wiring LE of the first circuit board 300. Although FIG. 2 shows five signal wirings PAD, the number of signal wirings PAD may be one to four, or six or more, without being limited thereto.

The signal wirings PAD may be connected via the lead wiring LE and a conductive member CM as shown in the enlarged view of FIG. 5. The conductive member CM may be an anisotropic conductive film (ACF). In some exemplary embodiments, the signal wirings PAD may be directly connected to the lead wiring LE without the conductive member. That is, the signal wirings PAD may be ultrasonically bonded to the lead wiring LE.

The signal wirings PAD may include at least one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The signal wirings PAD may be a single film made of the above-exemplified material. Without being limited thereto, the signal wirings PAD may be a laminated film. For example, the signal wirings PAD may be formed of a laminated structure of Ti/Al/Ti, Mo/Al/Mo, Mo/AlGe/Mo, Ti/Cu, or the like.

The signal wirings PAD may have a linear shape extending along the third direction DR3, as shown in FIG. 2.

The signal wirings PAD may be disposed over the first side surface 110s1 of the lower substrate 110 and the first side surface 150s1 of the upper substrate 150. As shown in FIG. 2, the signal wirings PAD may cover the first side surface 110s1 of the lower substrate 110 in the thickness direction and cover at least a part of the first side surface 150s1 of the upper substrate 150 in the thickness direction to partially expose an upper end portion of the first side surface 150s1 of the upper substrate 150. However, the inventive concepts are not limited thereto, and the signal wirings PAD may cover at least a part of the first side surface 110s1 of the lower substrate 110 in the thickness direction to partially expose a lower end portion of the first side surface 110s1 of the lower substrate 110.

The signal line PAD may have a first thickness t1 from the first side surface 110s1 of the lower substrate 110 and the first side surface 150s1 of the upper substrate 150 as shown in FIG. 5.

The plurality of signal wirings PAD may be arranged along the extending direction of the first side surface 100s1 of the display panel 100. For example, the plurality of signal wirings PAD may be arranged along the first direction DR1. In some exemplary embodiments, the plurality of signal wirings PAD may be arranged in a zigzag shape along the first direction DR1. That is, the plurality of signal wirings PAD may be arranged along the first direction DR1 to intersect with the adjacent signal wirings PAD along the third direction DR3.

The first circuit board 300 may further include a plurality of lead wirings LE disposed on the base film 310. The plurality of lead wirings LE may be disposed on the one surface of the first circuit board 300. The plurality of lead wirings LE may be connected to the plurality of signal wirings PAD of the display panel 100.

The lead wirings LE may include a metal material. Each of the lead wirings LE may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The planar shape of the lead wirings LE in the second direction DR2 may be the same as or substantially similar to the planar shape of the signal wirings PAD as described above. That is, the planar shape of the lead wirings LE in the second direction DR2 may be a linear shape extending along the third direction DR3.

Meanwhile, referring to FIG. 3, the lead wirings LE may include lead patterns LP1 and LP2 having different thicknesses from the base film 310. Each of the lead patterns LP1 and LP2 may be referred to as a lead portion. That is, the first lead pattern LP1 may be referred to as a first lead portion and the second lead pattern LP2 may be referred to as a second lead portion.

The lead patterns LP1 and LP2 of the lead wirings LE having different thicknesses may be bonded to different surfaces of the signal wirings PAD of the display panel 100. As shown in FIG. 2, the first lead pattern LP1 may be disposed on the first side surface 150s1 of the upper substrate 150 of the display panel 100, and the second lead pattern LP2 may be disposed on the first side surface 110s1 of the lower substrate 110 of the display panel 100.

As shown in FIG. 5, the first lead pattern LP1 of the lead wirings LE may have a second thickness t2 from the base film 310, and the second lead pattern LP2 of the lead wirings LE may have a third thickness t3 smaller than the second thickness t2 from the base film 310.

Referring again to FIG. 3, the first lead pattern LP1 of the lead wirings LE may be disposed on the upper end portion of the base film 310 in the third direction DR3, and the second lead pattern LP2 may be physically connected to the first lead pattern LP1 and disposed at the lower end portion of the first lead pattern LP1. The surface of the first lead pattern LP1 protrudes toward the one surface of the first circuit board 300 as compared to the surface of the second lead pattern LP2. The surface of the second lead pattern LP2 may be bonded to one surface of the signal wiring PAD facing the first circuit board 300, and the lower surface of the protruding portion of the first lead pattern LP1 may be bonded to the upper surface of the signal wirings PAD. That is, the first lead pattern LP1 may be seated on the signal wirings PAD on the first side surface 150s1 of the upper substrate 150 on which the signal wirings PAD are exposed. As a result, a bonding force between the signal wirings PAD and the lead wirings LE can be increased.

Referring to FIGS. 4 and 5, the signal wiring PAD may include upper and lower surfaces and a plurality of side surfaces. The first lead pattern LP1 of the lead wiring LE may include upper and lower surfaces and a plurality of side surfaces, and the second lead pattern LP2 of the lead wiring LE may include upper and lower surfaces and a plurality of side surfaces.

A first side surface PADa of the signal wiring PAD may be disposed on the first side surface 110s1 of the lower substrate 110 and the first side surface 150s1 of the upper substrate 150. A second side surface PADb of the signal wiring PAD opposite to the first side surface PADa may be bonded to a second side surface LP2b of the second lead pattern LP2 of the lead wiring LE.

An upper surface LP1c of the signal wiring PAD is in contact with a lower surface LP of the first lead pattern LP1 of the lead wiring LE, and a lower surface LP1d of the signal wiring PAD opposite to the upper surface LP1c of the signal wiring PAD may be, although not shown, bonded to the second side surface LP2b of the second lead pattern LP2 of the lead wiring LE when the first circuit board 300 is bent to the lower side of the display panel 100.

Further, a part of the lower surface LP1c of the first lead pattern LP1 may be physically connected to the second lead pattern LP2 while the other part of the lower surface LP1c of the first lead pattern LP1 (adjacent to the display panel 100 than the above part) may be bonded to an upper surface PADc of the signal wiring PAD. A first side surface LP1a of the first lead pattern LP1 may be in contact with the base film 310.

As shown in FIG. 5, the second thickness t2 of the first lead pattern LP1 of the lead wiring LE may be smaller than the sum of the third thickness t3 of the second lead pattern LP2 and the first thickness t1 of the signal wiring PAD. In this case, as illustrated in the figure, a second side surface LP1b opposite to the first side surface LP1a of the first lead pattern LP1 may be spaced apart from and opposite to the first side surface 100s1 of the upper substrate 150 of the display panel 100.

However, the inventive concepts are not limited thereto, and the second thickness t2 of the first lead pattern LP1 of the lead wiring LE may be equal to the sum of the third thickness t3 of the second lead pattern LP2 and the first thickness t1 of the signal wiring PAD. In this case, unlike the illustrated example, the second side surface LP1b of the first lead pattern LP1 may be in contact with the first side surface 100s1 of the upper substrate 150 of the display panel 100.

The upper surface of the second lead pattern LP2 may be physically connected to the lower surface LP1c of the first lead pattern LP1. A first side surface LP2a of the second lead pattern LP2 may be contact with the base film 310 and a second side surface LP2b opposite to the first side surface LP2a of the second lead pattern LP2 may be bonded to the second side surface PADb of the signal wiring PAD.

Figure 7:
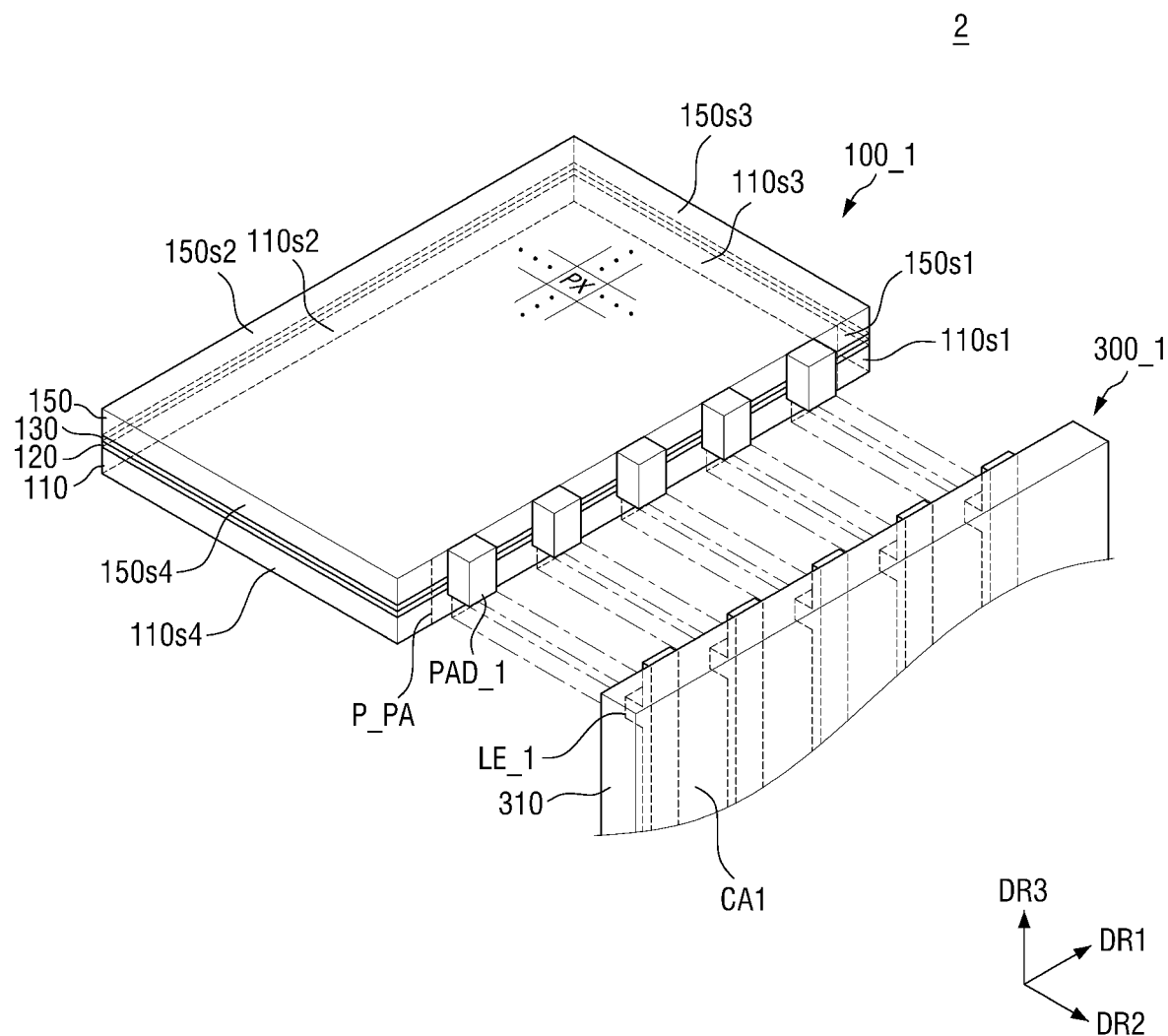
FIG. 7 is an exploded perspective view of a display device according to another exemplary embodiment.

Referring to FIG. 7, as described above, the second side surface LP2b of the second lead pattern LP2 and the second side surface PADb of the signal wiring PAD may be bonded to each other by a first bonding force BF1. That is, the first bonding force BF1 may be a force to bond the second side surface LP2b of the second lead pattern LP2 and the second side surface PADb of the signal wiring PAD through the above-described conductive member CM. The first bonding force BF1 may be a lateral force.

The lower surface LP of the first lead pattern LP1 and the upper surface PADc of the signal wiring PAD may be bonded to each other by a second bonding force BF2. That is, the second bonding force BF2 may be a force to bond the lower surface LP1c of the first lead pattern LP1 and the upper surface PADc of the signal wiring PAD through the above-described conductive member CM. The second bonding force BF2 may be a vertical force.

Meanwhile, each of the magnitudes of the first bonding force BF1 and the second bonding force BF2 may be proportional to the bonding area. In a manufacturing process and/or use of the display device, when the display surface is located in a gravitational direction and the side surfaces of the display panel are located in a direction crossing the gravitational direction, the bonding between the second side surface LP2b of the second lead pattern LP2 and the second side surface PADb of the signal wiring PAD may be weakened due to an influence of gravity in the gravitational direction although it has the first bonding force BF1 proportional to the bonding area, which may cause a bonding failure in which the signal wiring PAD and the lead wiring LE are separated from each other.

However, the lead wiring LE of the display device 1 according to an exemplary embodiment includes the first lead pattern LP1 protruding toward the signal wiring PAD in comparison with the second lead pattern LP2. The first lead pattern LP1 may include a portion protruding toward the signal wiring PAD in comparison with the second lead pattern LP2 to be seated and bonded to the upper surface PADc of the signal wiring PAD. As described above, a portion of the lead wiring LE protrudes toward the signal wiring PAD and is seated on the upper surface PADc of the signal wiring PAD so that the bonding between the lower surface LP1c of the first lead pattern LP1 and the upper surface PADc of the signal wiring PAD can be further enhanced by the gravity as well as the second bonding force BF2. Thus, the overall bonding force between the signal wiring PAD and the lead wiring LE can be increased to prevent or suppress a bonding failure in advance.

Hereinafter, other exemplary embodiments will be described. In the following exemplary embodiments, the same components as those of the above-described embodiment are denoted by the same reference numerals and a description thereof will be omitted or simplified.

Figure 8:
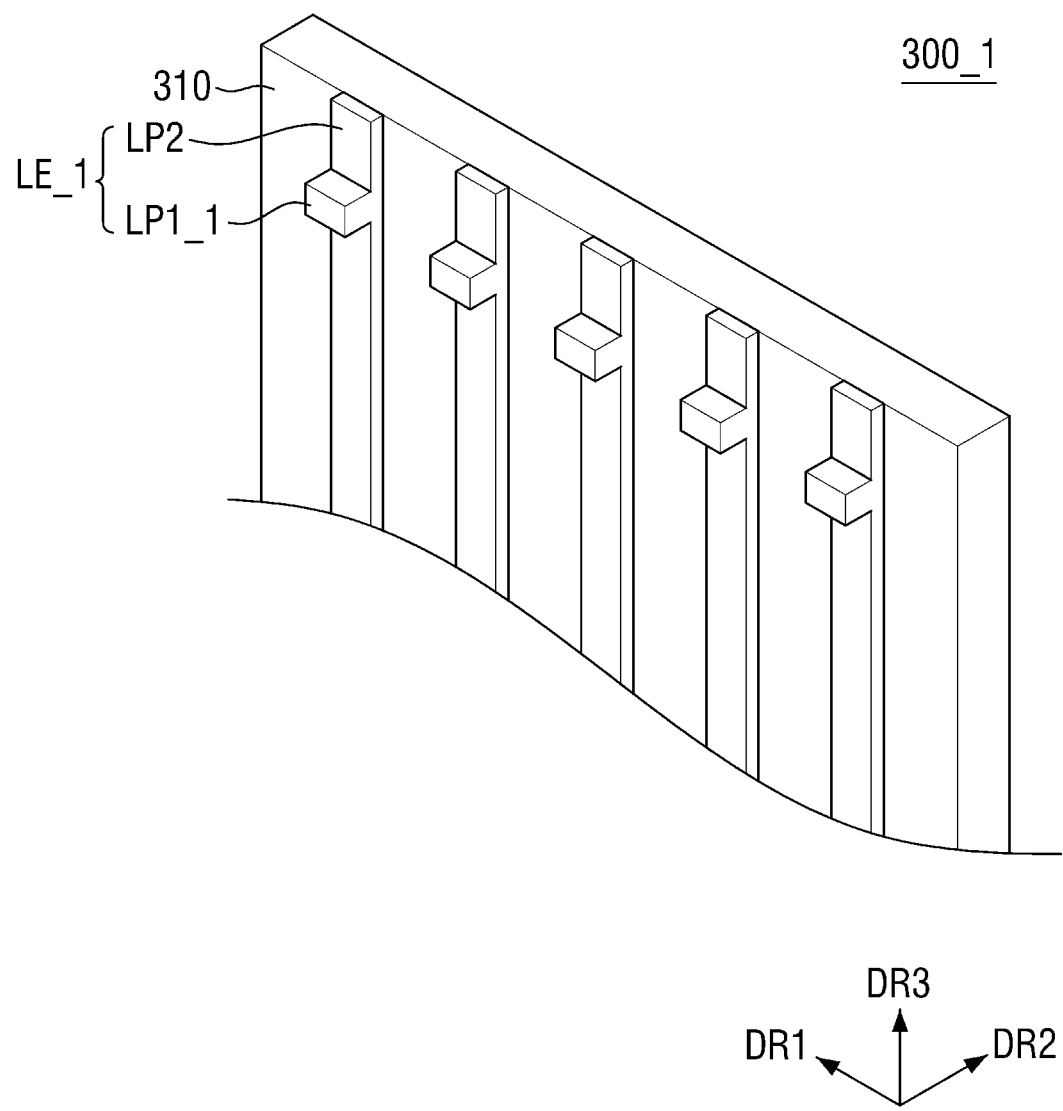
FIG. 8 is a perspective view of a first circuit board according to another exemplary embodiment.
Figure 9:
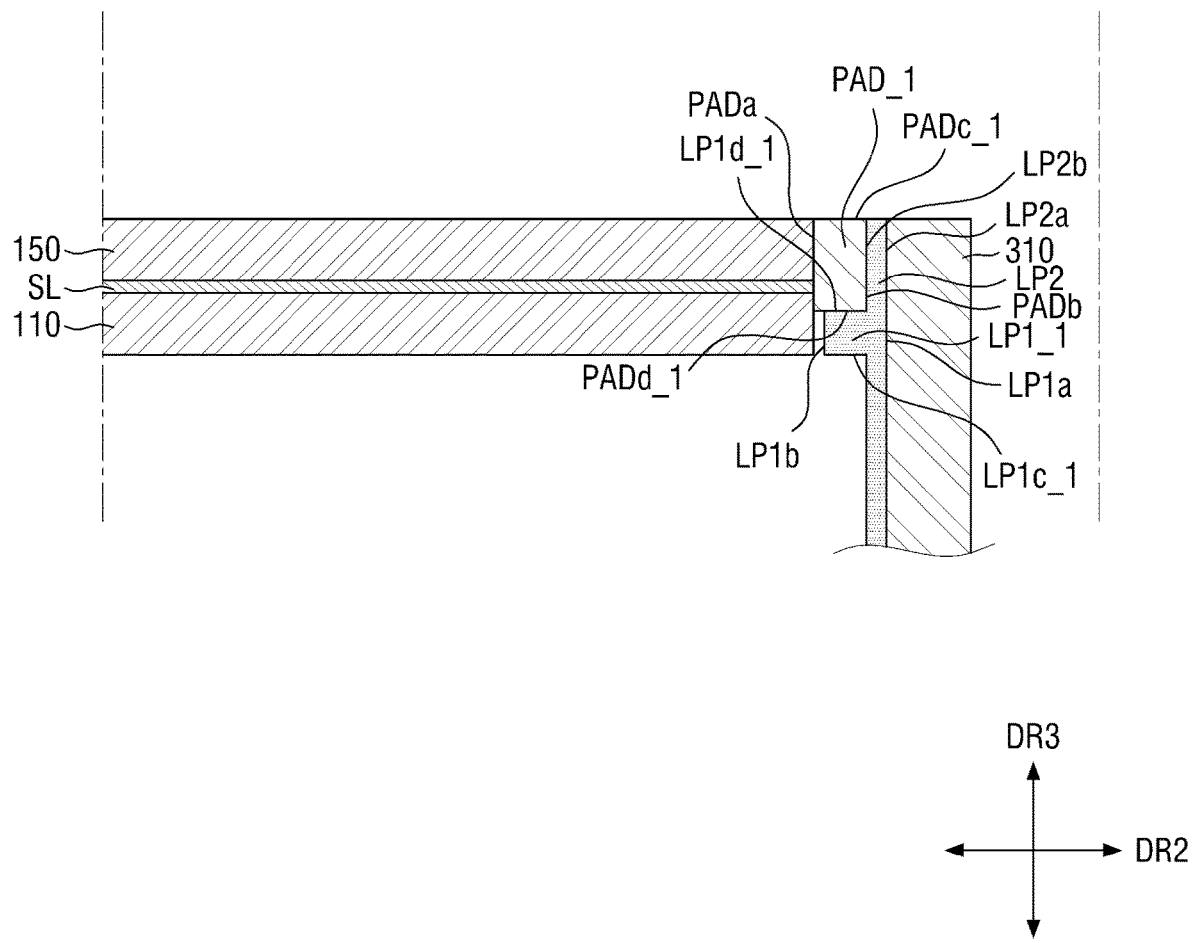
FIG. 9 is a cross-sectional view of a display device according to another exemplary embodiment.

FIG. 7 is an exploded perspective view of a display device according to another exemplary embodiment. FIG. 8 is a perspective view of a first circuit board according to another exemplary embodiment. FIG. 9 is a cross-sectional view of a display device according to another exemplary embodiment.

Referring to FIGS. 7, 8, and 9, a display device 2 according to the present exemplary embodiment is different from the display device 1 of the above-described embodiment in that signal wirings PAD expose a lower end portion of a first side surface 110s1 of a lower substrate 110 and lead wirings LE_1 are bonded to the lower surface of the signal wirings PAD.

More specifically, the signal wirings PAD may expose the lower end portion of the first side surface 110s1 of the lower substrate 110. As shown in FIG. 8, a first lead pattern LP1_1 of the lead wirings LE_1 may be disposed below a second lead pattern LP2 in a third direction DR3.

Referring to FIG. 9, a lower surface PADd_1 of the signal wiring PAD may be bonded to an upper surface LP1d_1 of the first lead pattern LP1_1.

The lead wiring LE_1 of the display device 2 according to the present exemplary embodiment includes the first lead pattern LP1_1 protruding toward the signal wiring PAD in comparison with the second lead pattern LP2. The first lead pattern LP1_1 may include a portion protruding toward a signal wiring PAD_1 in comparison with the second lead pattern LP2 to be bonded to a lower surface PADd_1 of the signal wiring PAD_1. That is, the lower surface PADd_1 of the signal wiring PAD_1 may be seated and bonded to the first lead pattern LP_1. As described above, a portion of the lead wiring LE_1 protrudes toward the signal wiring PAD_1 and is bonded to the lower surface PADd_1 of the signal wiring PAD_1 so that the overall bonding force between the lead wiring LE_1 and the signal wiring PAD_1 can be increased.

Figure 10:
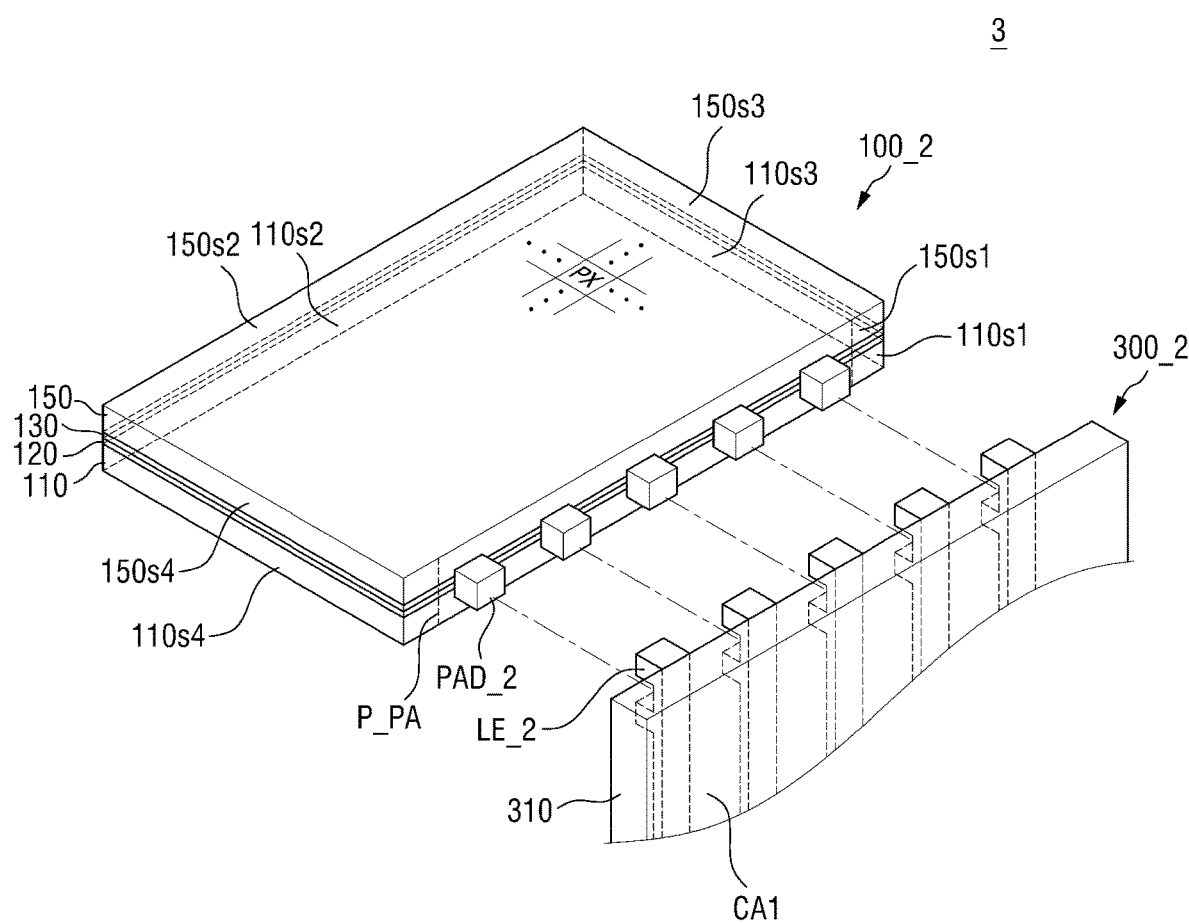
FIG. 10 is an exploded perspective view of a display device according to still another exemplary embodiment.
Figure 11:
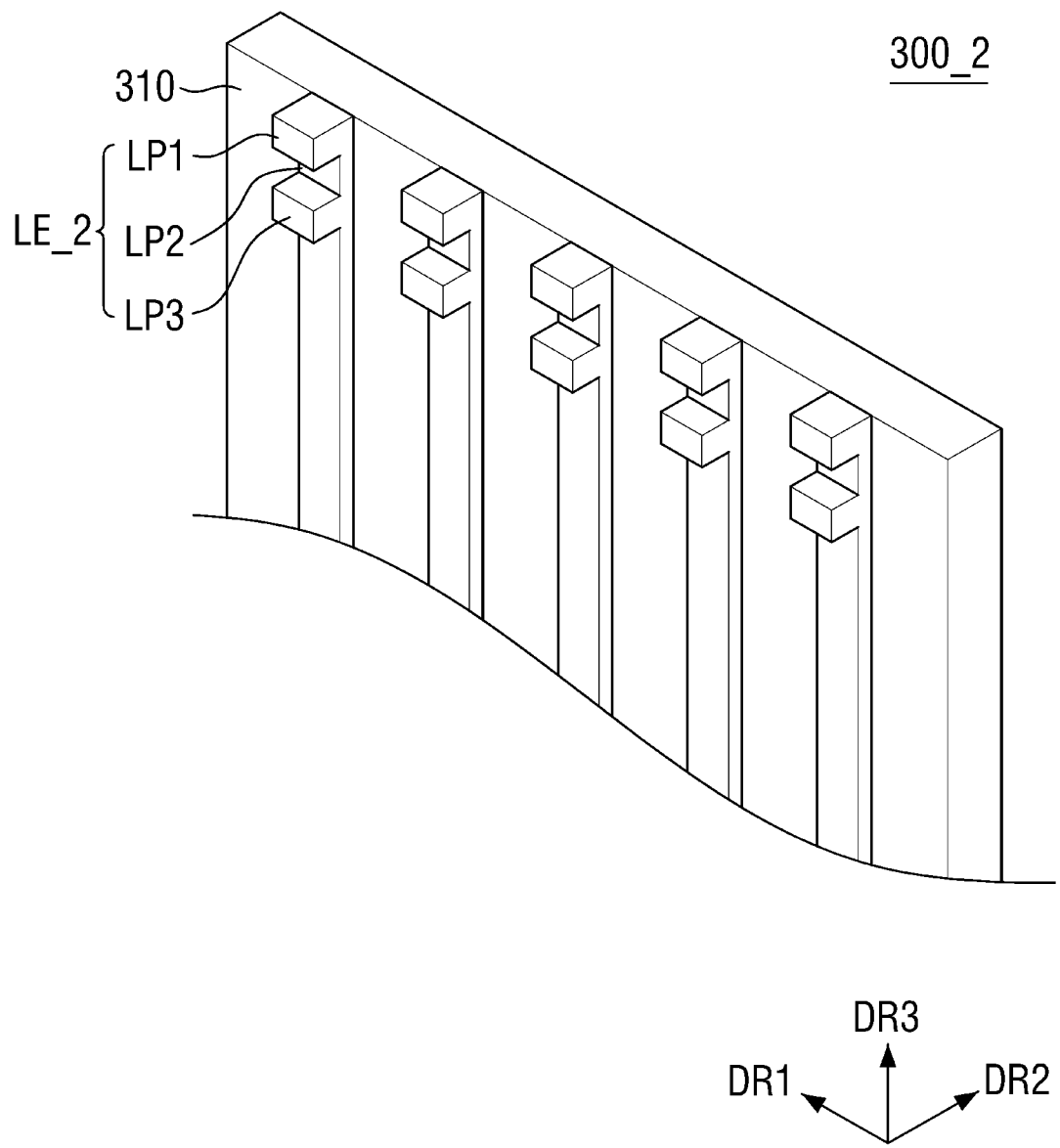
FIG. 11 is a perspective view of a first circuit board according to still another exemplary embodiment.
Figure 12:
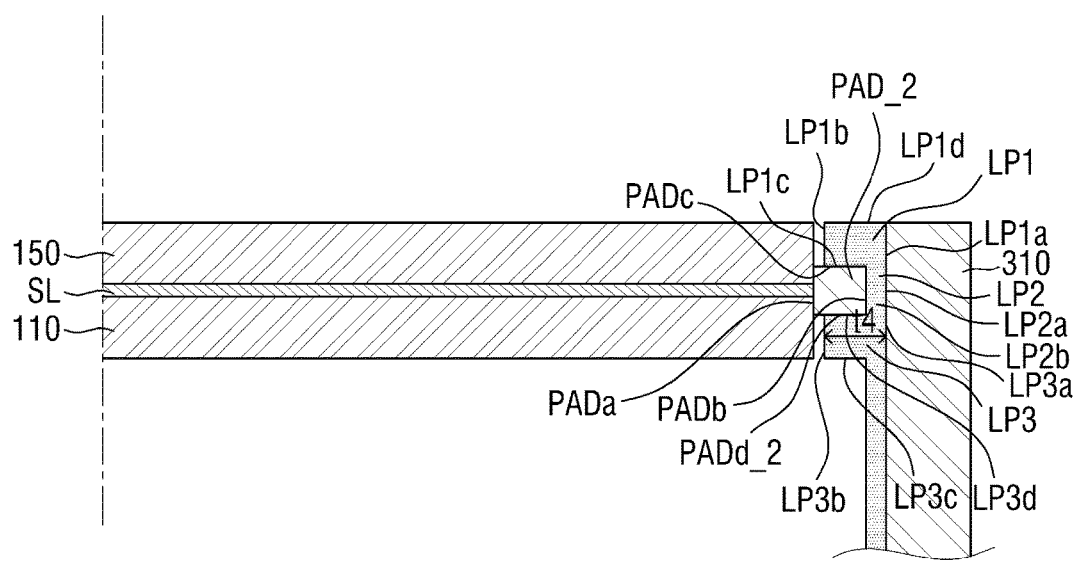
FIG. 12 is a cross-sectional view of a display device according to still another exemplary embodiment.

FIG. 10 is an exploded perspective view of a display device according to still another exemplary embodiment. FIG. 11 is a perspective view of a first circuit board according to still another exemplary embodiment. FIG. 12 is a cross-sectional view of a display device according to still another exemplary embodiment.

Referring to FIGS. 10, 11, and 12, a display device 3 according to the present exemplary embodiment is different from the display device 1 of the above-described embodiment in that signal wirings PAD_2 expose a part of first side surfaces 110s1 and 150s1 of an upper substrate 150 and a lower substrate 110 and lead wirings LE_2 further include a third lead pattern LP3 disposed below a second lead pattern LP2 in a third direction DR3 as shown in FIG. 10.

More specifically, in the display device 3 according to the present exemplary embodiment, the signal wirings PAD_2 may expose a part of the first side surfaces 110s1 and 150s1 of the upper substrate 150 and the lower substrate 110. That is, the signal wirings PAD_2 may expose an upper end portion of the first side surface 150s1 of the upper substrate 150 and expose a lower end portion of the first side surface 110s1 of the lower substrate 110.

In a first circuit board 300_2 according to the present exemplary embodiment, the lead wirings LE_2 may further include the third lead pattern LP3 disposed below the second lead pattern LP2 in the third direction DR3. The third lead pattern LP3 may be substantially the same as a first lead pattern LP_1 described with reference to FIG. 7. That is, the third lead pattern LP3 may be spaced apart from a first lead pattern LP1 in the third direction DR3 with the second lead pattern LP2 interposed therebetween, and may have a fourth thickness t4 from a base film 310. The fourth thickness t4 of the third lead pattern LP3 may be the same as or similar to a second thickness t2 of the first lead pattern LP1. However, the inventive concepts are not limited thereto, and the fourth thickness t4 of the third lead pattern LP3 may be larger or smaller than the second thickness t2 of the first lead pattern LP1. Even in this case, the fourth thickness t4 of the third lead pattern LP3 is larger than a third thickness t3 of the second lead pattern LP2.

The third lead pattern LP3 may be bonded to a lower surface of the signal wiring PAD_2. A detailed description thereof will be omitted to avoid redundancy because it has been described above with reference to FIGS. 7, 8, 9, and 10.

The lead wiring LE_2 of the display device 3 according to the present exemplary embodiment includes the first lead pattern LP1 and the third lead pattern LP3 protruding toward the signal wiring PAD_2 in comparison with the second lead pattern LP2. The first lead pattern LP1 may include a portion protruding toward the signal wiring PAD_2 in comparison with the second lead pattern LP2 to be seated and bonded to an upper surface PADc of the signal wiring PAD_2.

Further, the third lead pattern LP3 may include a portion protruding toward the signal wiring PAD_2 in comparison with the second lead pattern LP2 to be bonded to a lower surface PADd_2 of the signal wiring PAD_2. That is, the lower surface PADd_2 of the signal wiring PAD_2 may be seated and coupled to the first lead pattern LP1.

As described above, a portion of the lead wiring LE_2 protrudes toward the signal wiring PAD and is bonded to the upper surface PADc and the lower surface PADd_2 of the signal wiring PAD_2 so that bonding between the lower surface LP1c of the first lead pattern LP1 and the upper surface PADc of the signal wiring PAD_2 and bonding between the upper surface LP3d of the third lead pattern LP3 and the lower surface PADd_2 of the signal wiring PAD_2 can be added. Thus, the overall bonding force between the signal wiring PAD_2 and the lead wiring LE_2 can be increased to prevent or suppress a bonding failure in advance.

Figure 13:
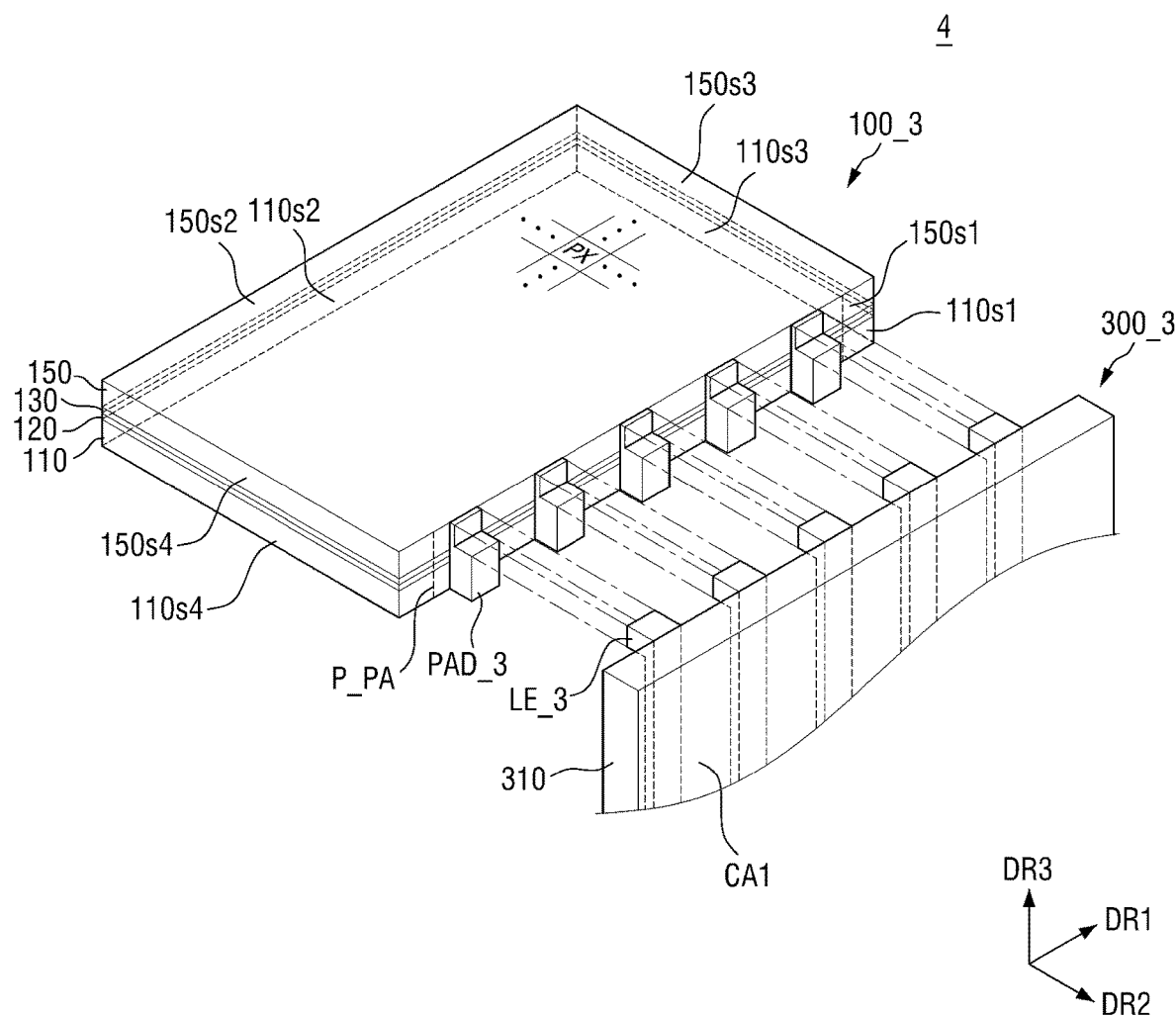
FIG. 13 is an exploded perspective view of a display device according to still another exemplary embodiment.
Figure 14:
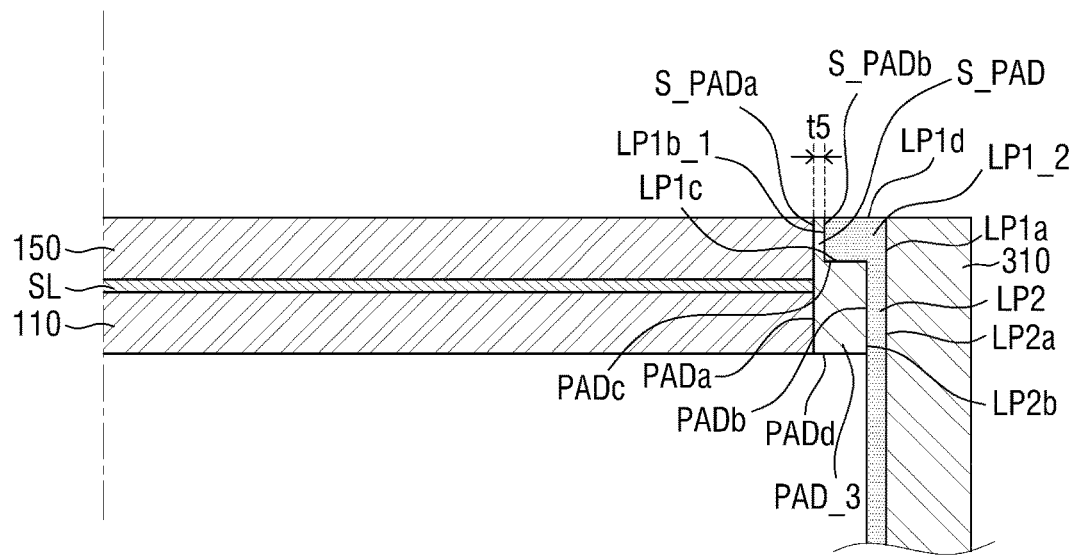
FIG. 14 is a cross-sectional view of a display device according to still another exemplary embodiment.
Figure 14:
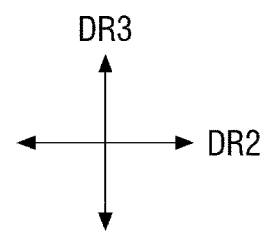

FIG. 13 is an exploded perspective view of a display device according to still another exemplary embodiment. FIG. 14 is a cross-sectional view of a display device according to still another exemplary embodiment.

Referring to FIGS. 13 and 14, a display device 4 according to the present exemplary embodiment is different from the display device 1 according to the above-described embodiment in that signal wirings PAD_3 further include sub signal wirings S_PAD.

More specifically, in the display device 4 according to the present exemplary embodiment, the signal wirings PAD_3 may further include the sub signal wirings S_PAD at an upper end portion of a first side surface 150s1 of an upper substrate 150 on which the signal wirings PAD are exposed. The signal wirings PAD of the signal wirings PAD_3 may be a first signal wiring pattern, and the sub signal wirings S_PAD of the signal wirings PAD_3 may be a second signal wiring pattern. The first and second signal wiring patterns may be one signal wiring in which they are physically connected to each other.

Referring to FIG. 14, the signal wiring PAD may have a first thickness t1 from a first side surface 110s1 of a lower substrate 110 and a first side surface 150s1 of an upper substrate 150 as described above, and the sub signal wiring S_PAD may have a fifth thickness t5 smaller than the first thickness t1. That is, the surface of the signal wiring PAD facing a first circuit board 300_3 protrudes toward the first circuit board 300_3 from the surface of the sub signal wiring S_PAD facing the first circuit board 300_3.

The sub signal wiring S_PAD may include a first side surface S_PADa attached to the first side surface 150s1 of the upper substrate 150, and a second side surface S_PADb opposite to the first side surface S_PADa and bonded to a first lead pattern LP1_2 of a lead wiring LE_3. In other words, a second side surface LP1b_1 of the first lead pattern LP1_2 of the lead wiring LE_3 may be bonded to the second side surface S_PADb of the sub signal wiring S_PAD.

In the present exemplary embodiment, the signal wiring PAD_3 further includes the sub signal wiring S_PAD disposed at the upper end portion of the signal wiring PAD, and the sub signal wiring S_PAD is bonded to the first lead pattern LP1_2 of the lead wiring LE_3 so that a bonding force of the display device 4 can be further increased.

Figure 15:
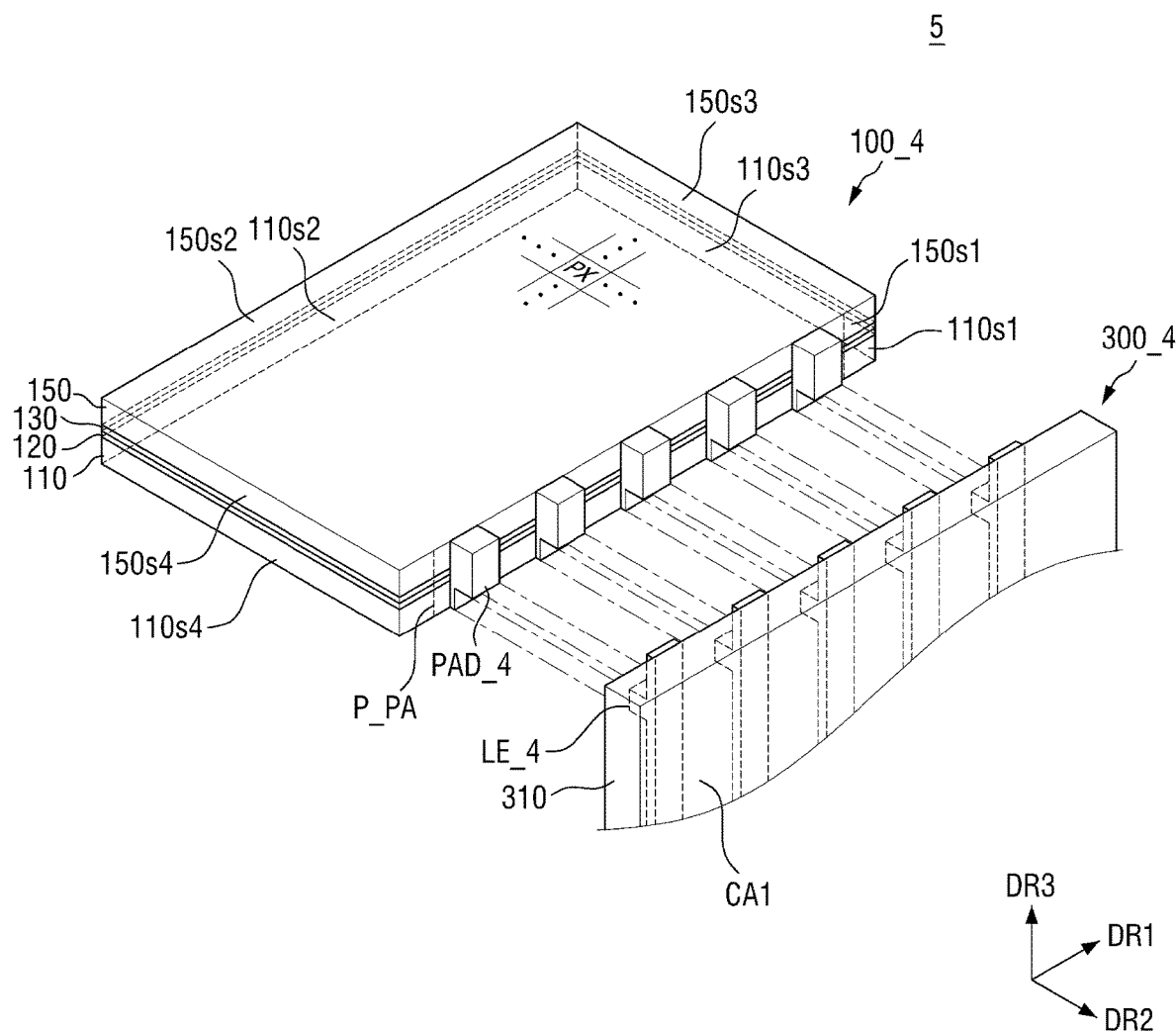
FIG. 15 is an exploded perspective view of a display device according to still another exemplary embodiment.
Figure 16:
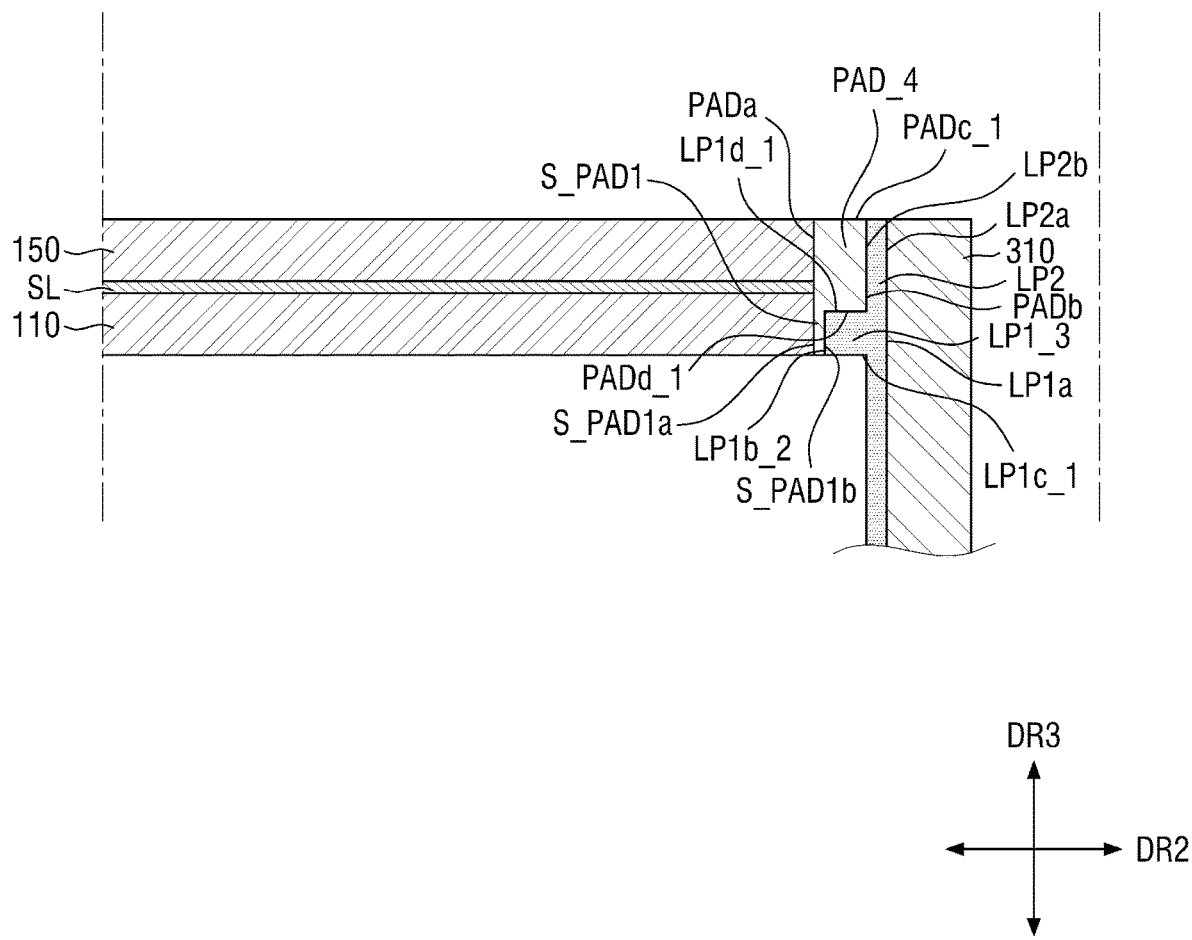
FIG. 16 is a cross-sectional view of a display device according to still another exemplary embodiment.

FIG. 15 is an exploded perspective view of a display device according to still another exemplary embodiment. FIG. 16 is a cross-sectional view of a display device according to still another exemplary embodiment.

Referring to FIGS. 15 and 16, a display device 5 according to the present exemplary embodiment is different from the display device 2 shown in FIG. 7 in that signal wirings PAD_4 further include sub signal wirings S_PAD1 disposed at a lower end portion of a first side surface 110s1 of a lower substrate 110 on which the signal wirings PAD are exposed. The sub signal wirings S_PAD1 according to the present exemplary embodiment are different in position compared to the signal wirings PAD from the sub signal wirings S_PAD shown in FIGS. 13 and 14, but may have substantially the same thickness and shape as the sub signal wirings S_PAD. The sub signal wirings S_PAD may be physically connected to the signal wirings PAD at a lower end portion of the signal wirings PAD.

The sub signal wiring S_PAD1 may include a first side surface S_PAD1a attached to the first side surface 110s1 of the lower substrate 110, and a second side surface S_PAD1b opposite to the first side surface S_PAD1a and bonded to a first lead pattern LP1_3 of a lead wiring LE_4. In other words, a second side surface LP1b_2 of the first lead pattern LP1_3 of the lead wiring LE_4 may be bonded to the second side surface S_PADb1 of the sub signal wiring S_PAD1.

In the present exemplary embodiment, the signal wiring PAD_4 further includes the sub signal wiring S_PAD1 disposed at the lower end portion of the signal wiring PAD, and the sub signal wiring S_PAD1 is bonded to the first lead pattern LP1_3 of the lead wiring LE_4 so that a bonding force of the display device 5 can be further increased.

Figure 17:
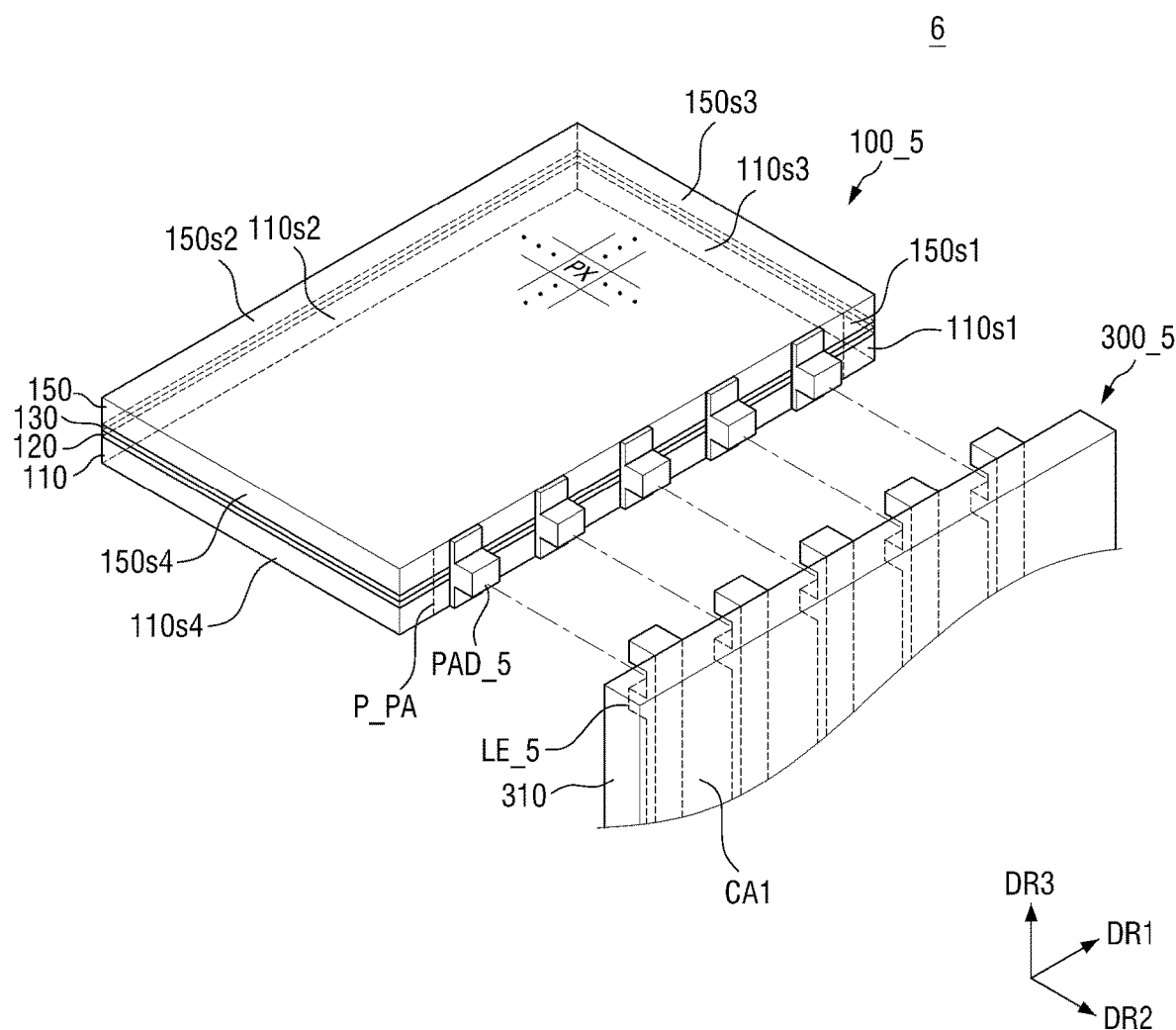
FIG. 17 is an exploded perspective view of a display device according to still another exemplary embodiment.
Figure 18:
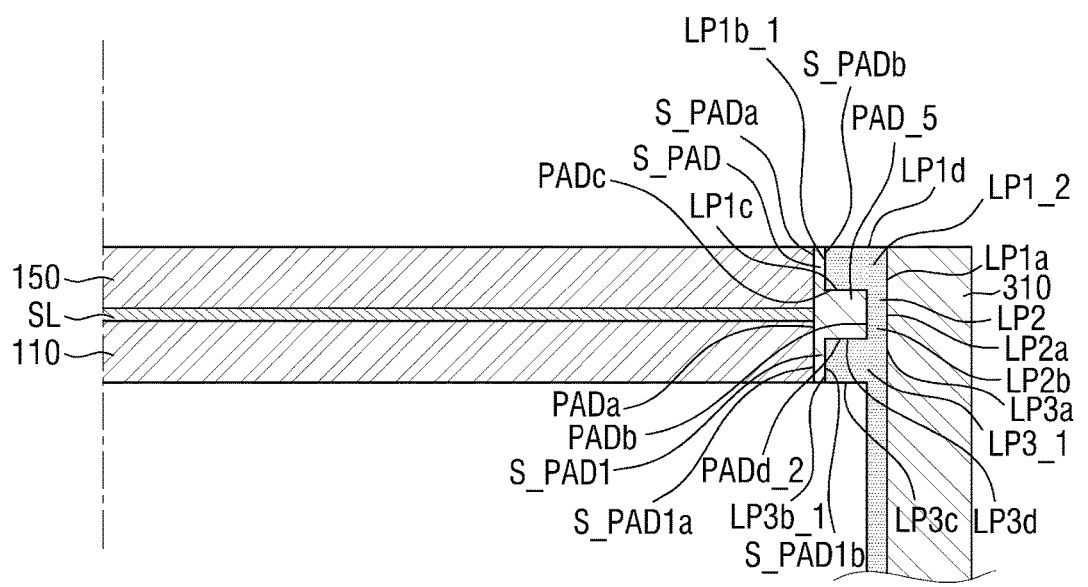
FIG. 18 is a cross-sectional view of a display device according to still another exemplary embodiment.
Figure 18:
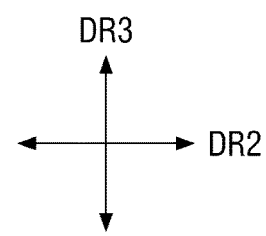

FIG. 17 is an exploded perspective view of a display device according to still another exemplary embodiment. FIG. 18 is a cross-sectional view of a display device according to still another exemplary embodiment.

Referring to FIGS. 17 and 18, a display device 6 according to the present exemplary embodiment is different from the display device 3 shown in FIGS. 10, 11, and 12 in that signal wirings PAD_5 further include first sub signal wirings S_PAD_1a at an upper end portion of a first side surface 150s1 of an upper substrate 150 on which the signal wirings PAD are exposed, and second sub signal wirings S_PAD_1b at a lower end portion of a first side surface 110s1 of a lower substrate 110 on which the signal wirings PAD are exposed.

The first sub signal wiring S_PAD_1a according to the present exemplary embodiment may be substantially the same as the sub signal wiring S_PAD shown in FIG. 14 and the second sub signal wiring S_PAD_1b may be substantially the same as the sub signal wiring S_PAD1 shown in FIG. 16. The sub signal wirings S_PAD_1a and S_PAD_1b according to the present exemplary embodiment may be spaced apart from each other along a third direction DR3 with the signal wiring PAD interposed therebetween.

In the present exemplary embodiment, the signal wiring PAD_5 further includes the first sub signal wiring S_PAD_1a disposed at the upper end portion of the signal wiring PAD and the second sub signal wiring S_PAD_1b disposed at the lower end portion of the signal wiring PAD, and the first sub signal wiring S_PAD_1a and the second sub signal wiring S_PAD_1b are bonded to a first lead pattern LP1_2 and a third lead pattern LP3_1 of a lead wiring LE_5, respectively, so that a bonding force of the display device 6 can be further increased.

Figure 19:
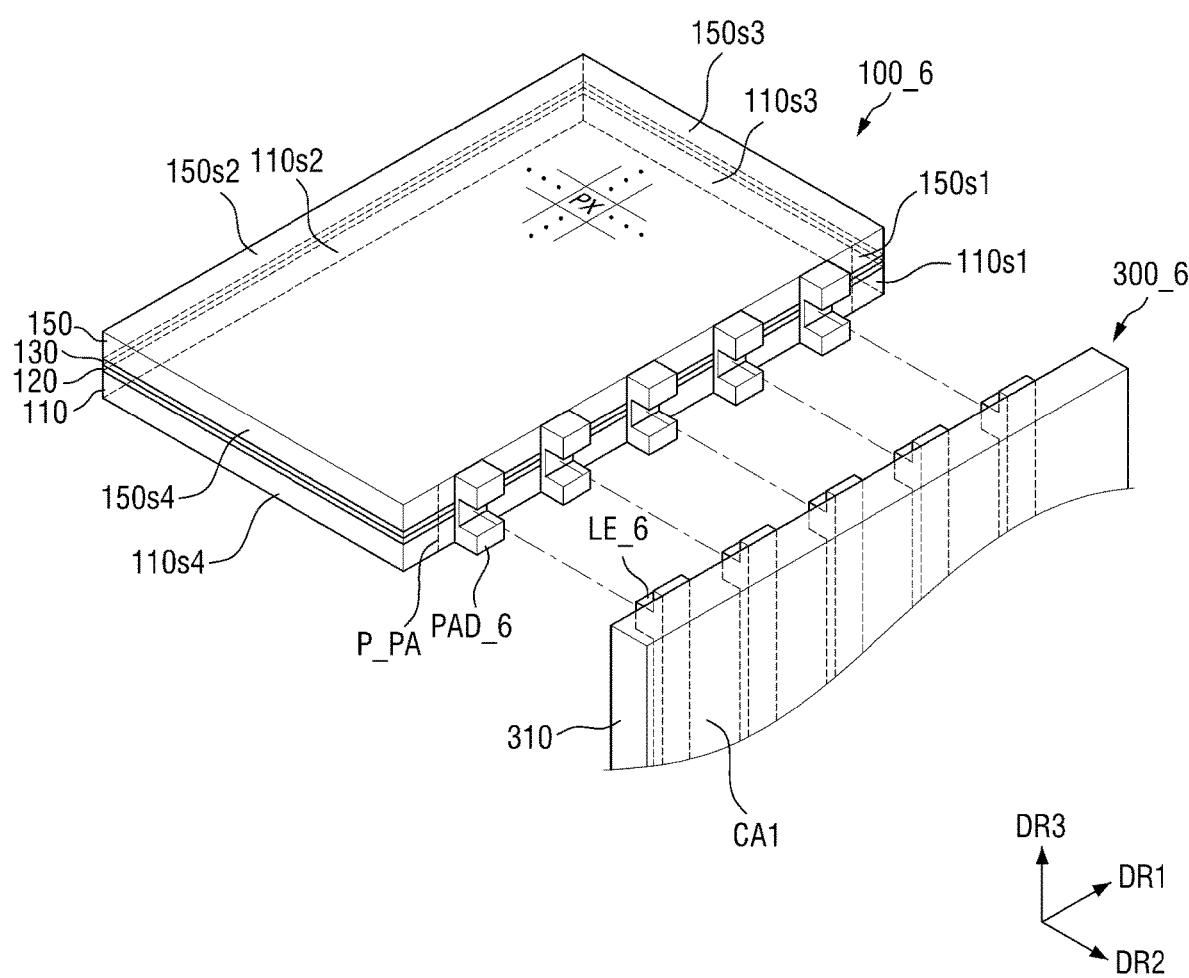
FIG. 19 is an exploded perspective view of a display device according to still another exemplary embodiment.
Figure 20:
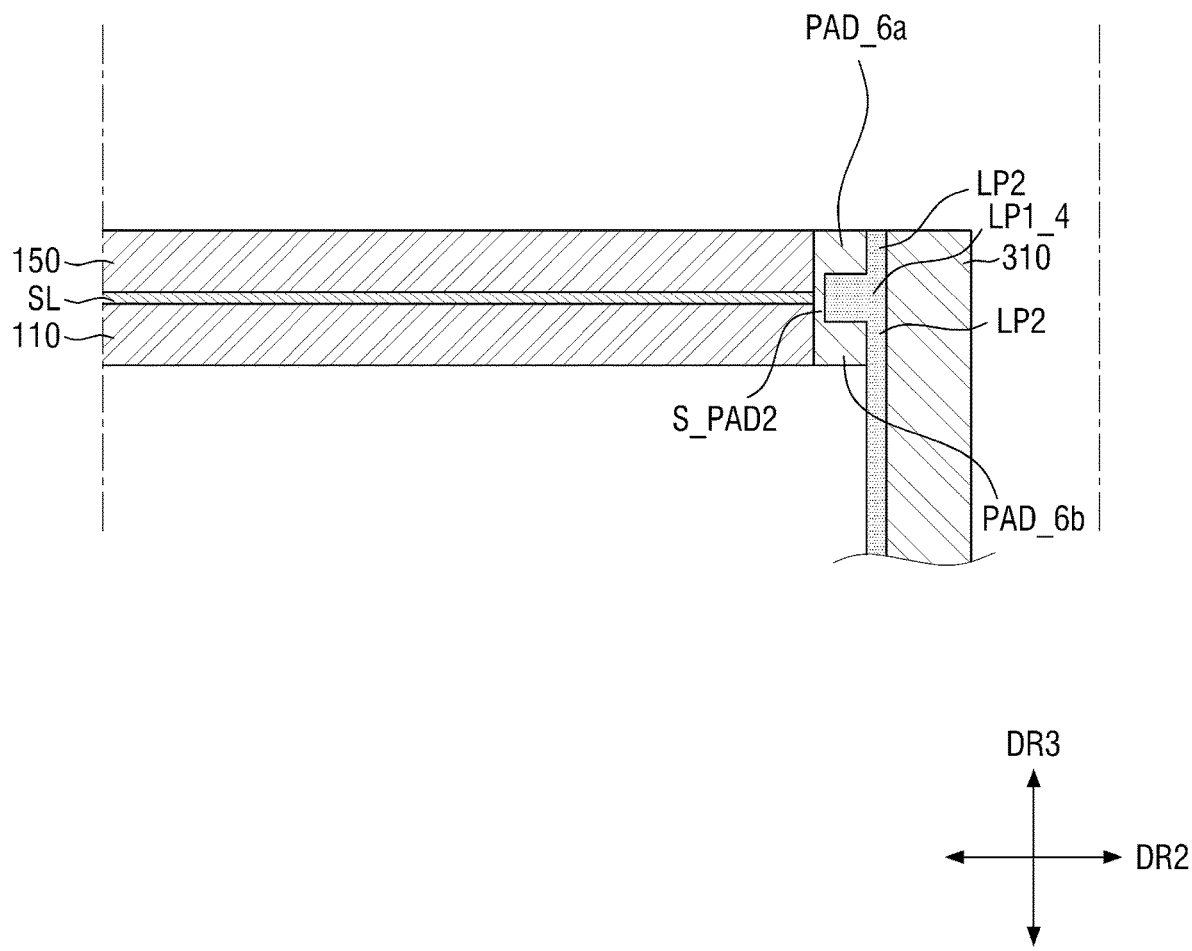
FIG. 20 is a cross-sectional view of a display device according to still another exemplary embodiment.

FIG. 19 is an exploded perspective view of a display device according to still another exemplary embodiment. FIG. 20 is a cross-sectional view of a display device according to still another exemplary embodiment.

Referring to FIGS. 19 and 20, a display device 7 according to the present exemplary embodiment is different from the display device 1 of the above-described embodiment in that one signal wiring PAD_6 includes signal wirings PAD_6a and PAD_6b separated from each other and further includes a sub signal wiring S_PAD2 in the separation space.

More specifically, in the display device 7 according to the present exemplary embodiment, one signal wiring PAD_6 may include the signal wirings PAD_6a and PAD_6b separated from each other, and the sub signal wiring S_PAD2 connecting them. The sub signal wiring S_PAD2 may have substantially the same shape as the sub signal wiring S_PAD described with reference to FIG. 14.

A lead wiring LE_6 of a first circuit board 300_6 according to the present exemplary embodiment may include a first lead pattern LP1_4 disposed between second lead patterns LP2 such that its surface facing first side surfaces 110s1 and 150s1 of an upper substrate 150 and a lower substrate 110 further protrudes from the surface of the adjacent second lead pattern LP2 facing the first side surfaces 110s1 and 150s1 of the upper substrate 150 and the lower substrate 110. The protruding portion of the first lead pattern LP1_4 may be bonded to the sub wiring S_PAD2 of the signal wiring PAD_6. Further, the upper and lower surfaces of the protruding portion of the first lead pattern LP1_4 may be bonded to the lower and upper surfaces of the signal wirings PAD_6a and PAD_6b, respectively. Thus, a bonding force between the lead wiring LE_6 and the signal wiring PAD_6 can be further increased, and the overall bonding force of the display device 7 can be further enhanced.

Figure 21:
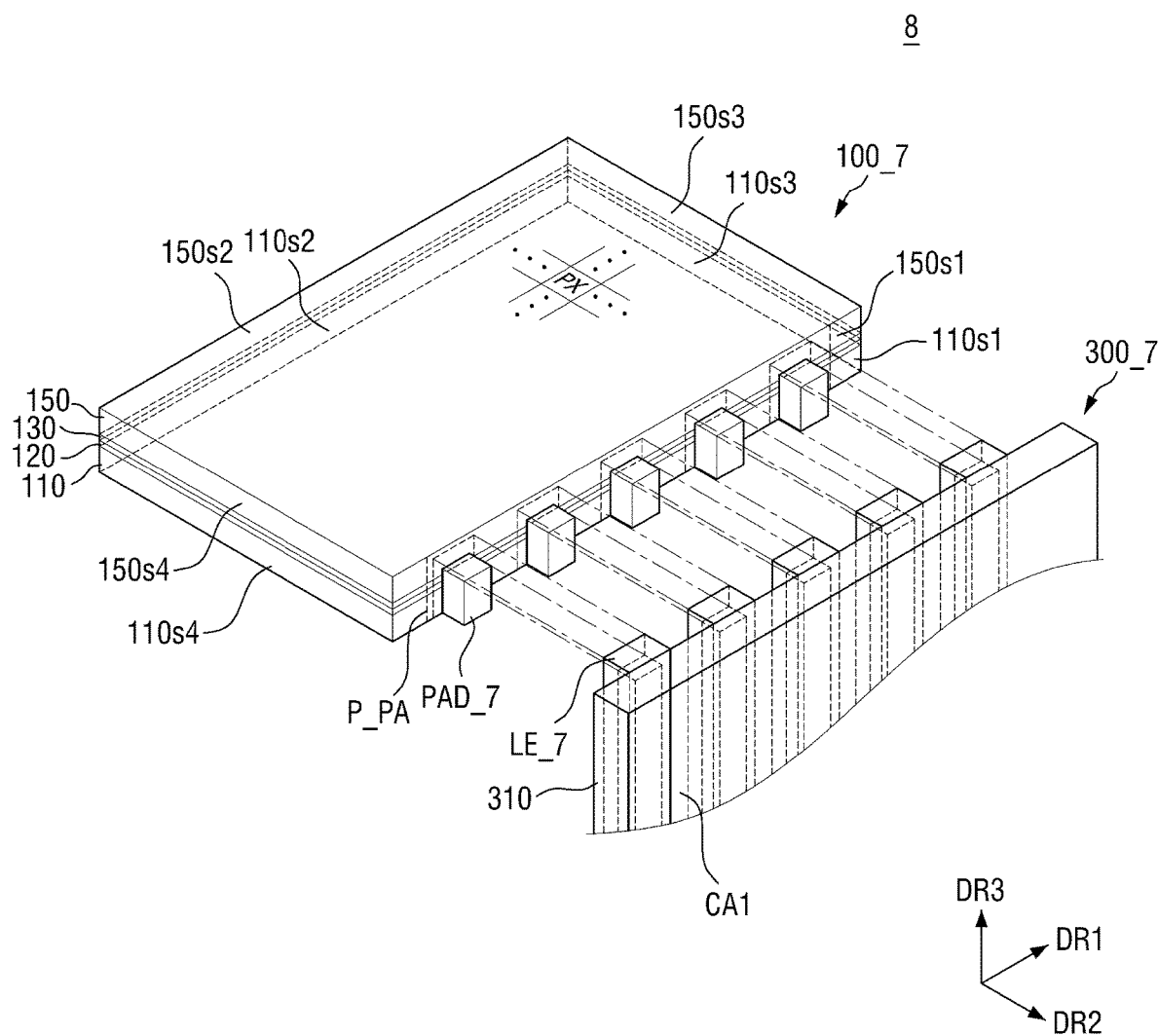
FIG. 21 is an exploded perspective view of a display device according to still another exemplary embodiment.
Figure 22:
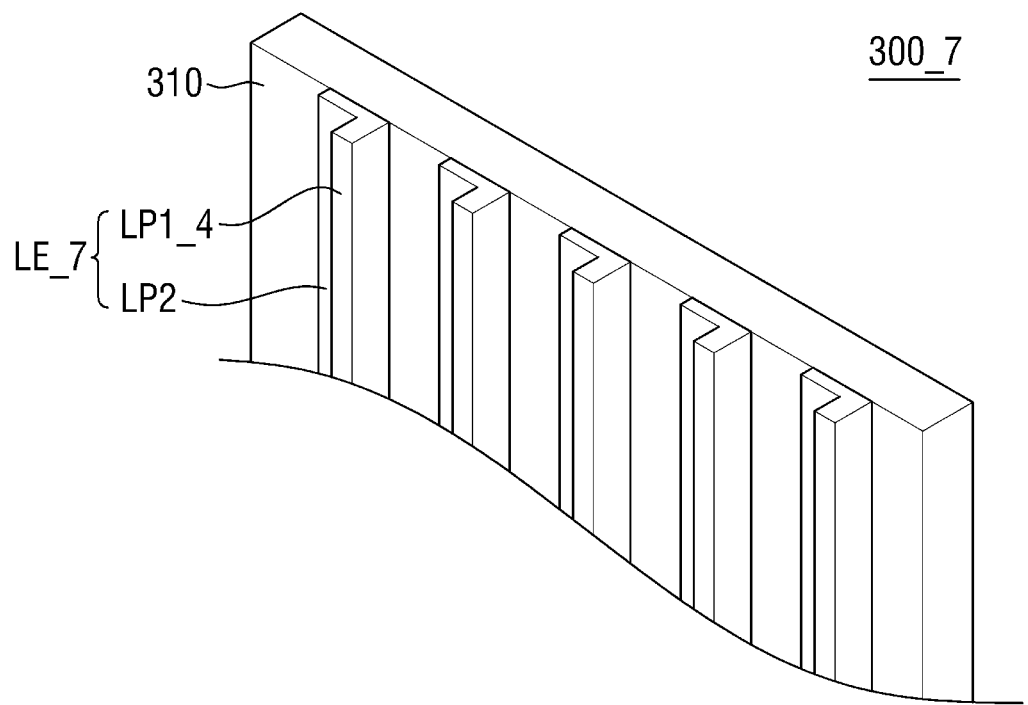
FIG. 22 is a perspective view of a first circuit board according to still another exemplary embodiment.
Figure 22:
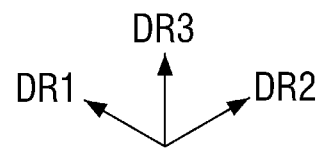

FIG. 21 is an exploded perspective view of a display device according to still another exemplary embodiment. FIG. 22 is a perspective view of a first circuit board according to still another exemplary embodiment.

Referring to FIGS. 21 and 22, a display device 8 according to the present exemplary embodiment is different from the display device 1 of the above-described embodiment in that a first lead pattern LP1_4 of a lead wiring LE_7 is disposed on one side of a second lead pattern LP2 in a side surface extending direction DR1 of a display panel.

More specifically, in the display device 8 according to the present exemplary embodiment, the first lead pattern LP1_4 of the lead wiring LE_7 may be disposed on one side of the second lead pattern LP2 in the side surface extending direction DR1 of the display panel. Although FIG. 21 illustrates a case where the first lead pattern LP1_4 is disposed on one side of a fourth side surface 150s4 of an upper substrate 150 of the second lead pattern LP2, the inventive concepts are not limited thereto. The first lead pattern LP1_4 may be disposed on one side of a third side surface 150s3 of the upper substrate 150 of the second lead pattern LP2.

The first lead pattern LP_4 may be bonded to another side surface of a signal wiring PAD_7 laterally intersecting with a surface facing a first circuit board 300_7. As shown in FIGS. 21 and 22, the first lead pattern LP_4 may be bonded to a side surface adjacent to a fourth side surface 150s4 of the upper substrate 150 among other side surfaces of the signal wiring PAD_7 laterally intersecting with the surface facing the first circuit board 300_7.

In some exemplary embodiments, the first lead pattern LP1_4 may be configured such that the first lead pattern LP1_4 of the lead wiring LE_7 is disposed on both one side and the other side of the second lead pattern LP2 in the side surface extending direction DR1 of the display panel.

In this case, the first lead pattern LP1_4 may be bonded to all of the other side surfaces of the signal wiring PAD_7 laterally intersecting with the surface facing the first circuit board 300_7.

Also in this exemplary embodiment, the lead wiring LE_7 may include the first lead pattern LP1_4 protruding toward the display panel in comparison with the second lead pattern LP2 to be bonded to another side surface of the signal wiring PAD_7 laterally intersecting with the surface facing the first circuit board 300_7. Thus, a bonding force between the lead wiring LE_7 and the signal wiring PAD_7 can be further increased, and the overall bonding force of the display device 8 can be further enhanced.

Figure 23:
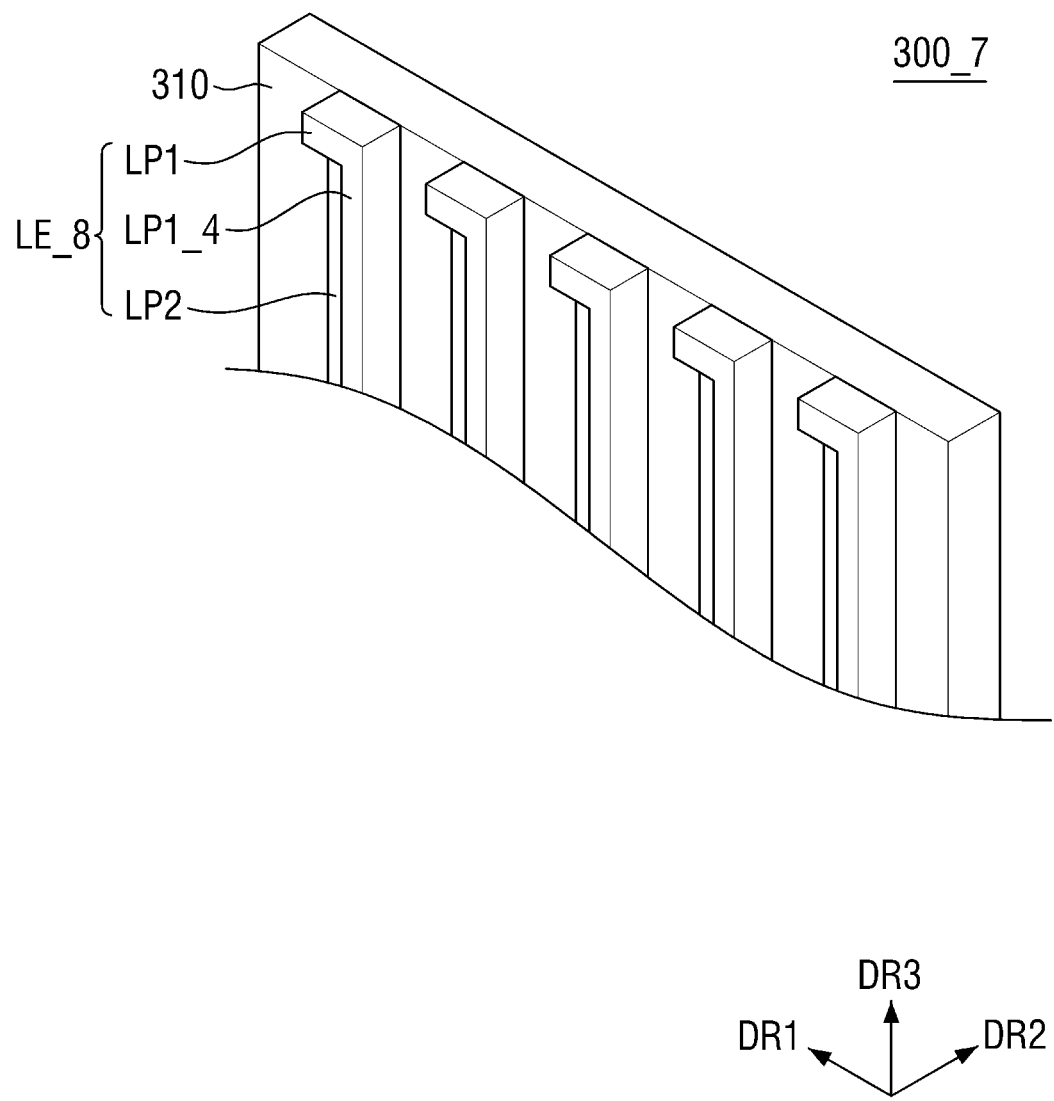
FIG. 23 is an exploded perspective view of a display device according to still another exemplary embodiment.

FIG. 23 is an exploded perspective view of a display device according to still another exemplary embodiment.

Referring to FIG. 23, a display device 9 according to the present exemplary embodiment is different from the embodiment of FIGS. 21 and 22 in that it further includes a first lead pattern LP1 of the lead wiring LE shown in FIG. 2.

More specifically, in the display device 9 according to the present exemplary embodiment, the first lead pattern LP_4 may be bonded to at least one of the other surfaces of the signal wiring PAD_7 laterally intersecting with the surface facing the first circuit board 300_7 and may be also bonded to the upper surface of the signal wiring PAD as the first lead pattern LP1 of the lead wiring LE shown in FIG. 2 is applied.

It is apparent that the lead wiring LE_8 can be applied in various combinations such as a combination of the lead wirings LE_1 and LE_2 shown in FIGS. 7 and 10, in addition to the above description.

The lead wiring LE_8 of the display device 9 according to the present exemplary embodiment includes not only a first lead pattern LP1_4 protruding toward a signal wiring PAD_8 in comparison with a second lead pattern LP2 but also a first lead pattern LP1 protruding toward the signal wiring PAD_8 in comparison with the second lead pattern LP2. The first lead pattern LP1 may include a portion protruding toward the signal wiring PAD_8 in comparison with the second lead pattern LP2 to be seated and bonded to the upper surface of the signal wiring PAD_8. As described above, a portion of the lead wiring LE_8 protrudes toward the signal wiring PAD_8 and is seated on the upper surface of the signal wiring PAD_8 so that the bonding between the lower surface of the first lead pattern LP1 and the upper surface of the signal wiring PAD_8 can be further enhanced. Thus, the overall bonding force between the signal wiring PAD_8 and the lead wiring LE_8 can be increased to prevent or suppress a bonding failure in advance.

Figure 24:
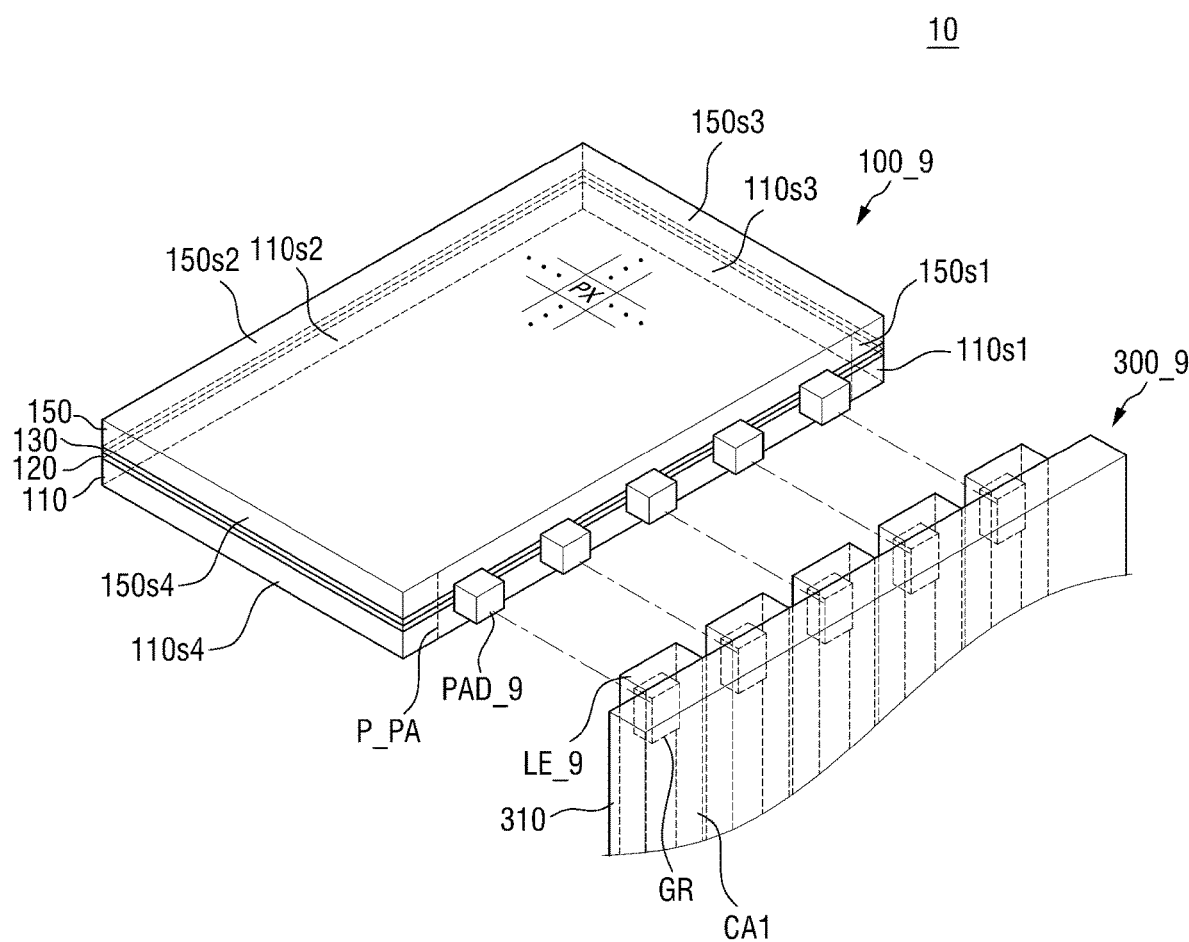
FIG. 24 is an exploded perspective view of a display device according to still another exemplary embodiment.
Figure 25:
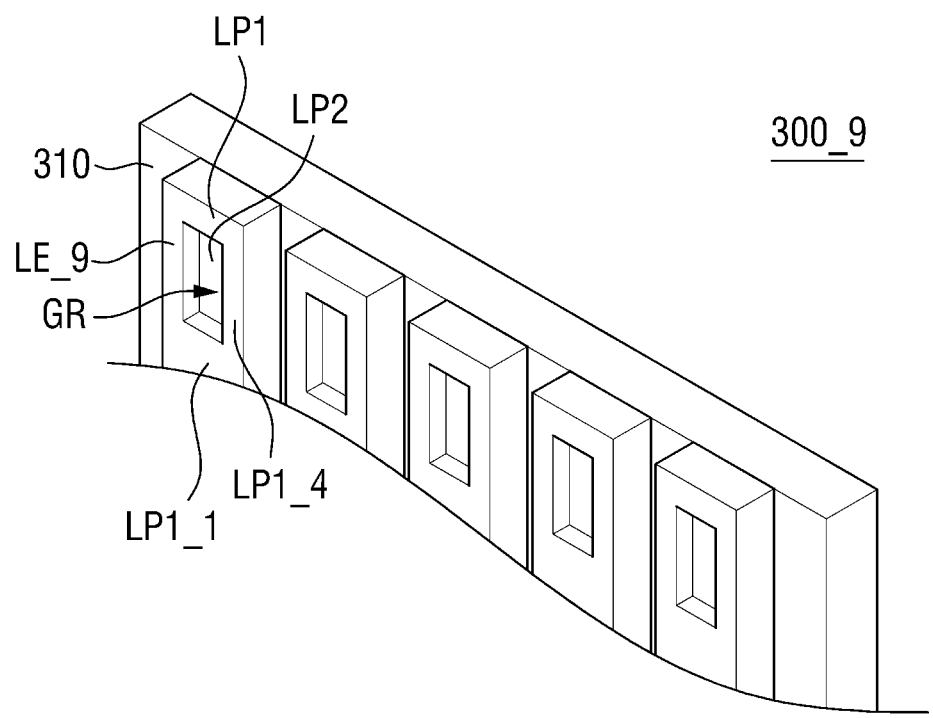
FIG. 25 is a perspective view of a first circuit board according to still another embodiment.

FIG. 24 is an exploded perspective view of a display device according to still another exemplary embodiment. FIG. 25 is a perspective view of a first circuit board according to still another exemplary embodiment. The embodiment of FIGS. 24 and 25 exemplifies one of various combinations described above in the embodiment of FIG. 23.

Referring to FIGS. 24 and 25, a display device 10 according to the present exemplary embodiment is different from the embodiment of FIG. 23 in that a lead wiring LE_9 includes a lead groove GR therein.

More specifically, a lead wiring LE_9 according to the present exemplary embodiment may be obtained by combining a case where it includes the lead patterns of FIGS. 2 and 7 and a case where the first lead pattern LP1_4 of FIG. 23 is disposed on both one side and the other side of the second lead pattern LP2 in the side surface extending direction DR1 of the display panel.

The lead patterns of FIGS. 2 and 7 and the lead patterns LP1_4 of FIG. 23 disposed on both one side and the other side of the second lead pattern LP2 in the side surface extending direction DR1 of the display panel protrude toward the signal wiring PAD_9 in comparison with the second lead pattern LP2. In other words, the surfaces of the lead patterns of FIGS. 2 and 7 and the lead patterns LP1_4 of FIG. 23 disposed on both one side and the other side of the second lead pattern LP2 in the side surface extending direction DR1 of the display panel protrude from the surface of the second lead pattern LP2. Due to a step of the surfaces, the lead wiring LE_9 may be provided with the lead groove GR therein. The lead groove GR is completely surrounded by the lead patterns protruding from the second lead pattern LP2 in a plan view.

The signal wiring PAD_9 according to the present exemplary embodiment may be bonded and/or seated on the lead groove GR and coupled at the side surfaces with the lead patterns protruding toward the signal wiring PAD_9 as compared to the second lead pattern LP2. Thus, the overall bonding force of the display device 10 can be further increased to prevent or suppress a bonding failure in advance.

Figure 26:
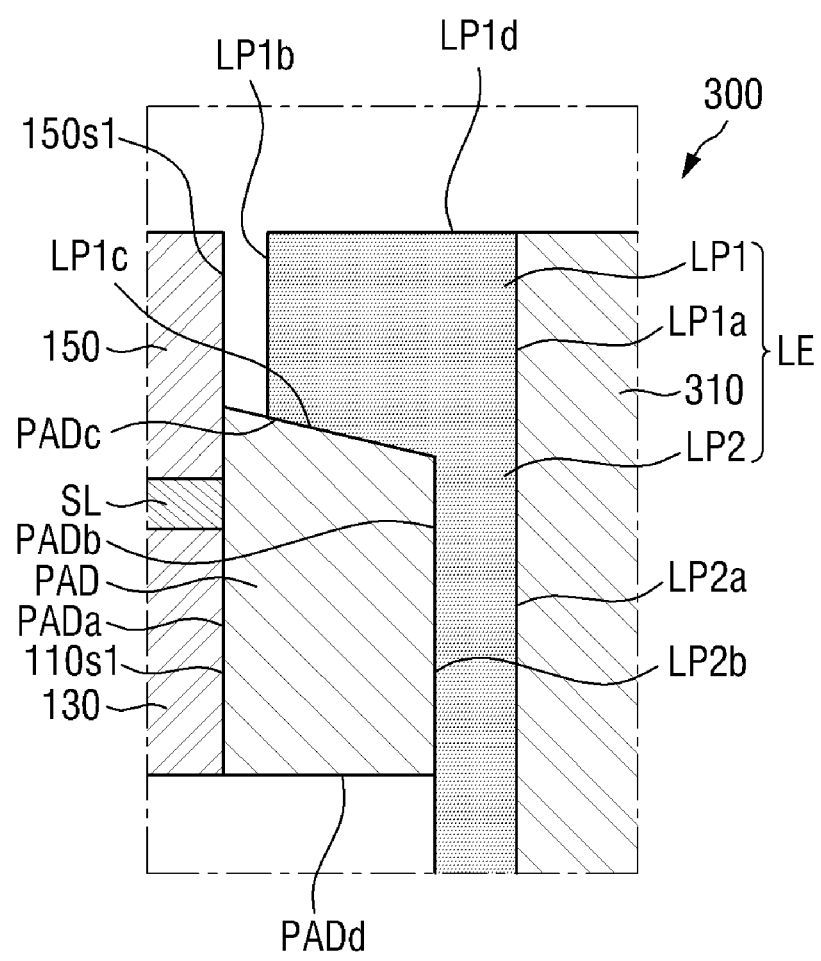
FIG. 26 is a cross-sectional view of display device according to still another exemplary embodiment.

FIG. 26 is a cross-sectional view of display device according to still another exemplary embodiment.

Referring to FIG. 26, the upper surface PADc of the signal wiring PAD and the lower surface LP of the first lead pattern LP1 contacting the upper surface PADc of the signal wiring PAD according to the present exemplary embodiment are inclined, respectively. It differs from the embodiment of FIG. 4 in that PADc and LP1c are inclined. The inclinations of the upper surface PADc of the signal wiring PAD and the lower surface LP of the first lead pattern LP1 are respectively extended in a direction between an extension direction of the first side surface LP2a of the second lead pattern LP2 (DR3) and an extension direction of the lower surface (PADd) of the signal wiring PAD (DR2). It may increase the contact area between the upper surface PADc and the lower surface LP1c. The inclinations of the upper surface PADc of the signal line PAD and the lower surface LP1c of the first lead pattern LP1 may be intentionally formed, but the present disclosure is not limited thereto and may be intentionally formed. The inclination of the upper surface PADc of the signal line PAD and the inclination of the lower surface LP1c of the first lead pattern LP1 according to FIG. 26 can be applied to the surface of the signal line and the surface of the lead pattern which are in contact with each other in the thickness direction of the aforementioned embodiments.

Figure 27:
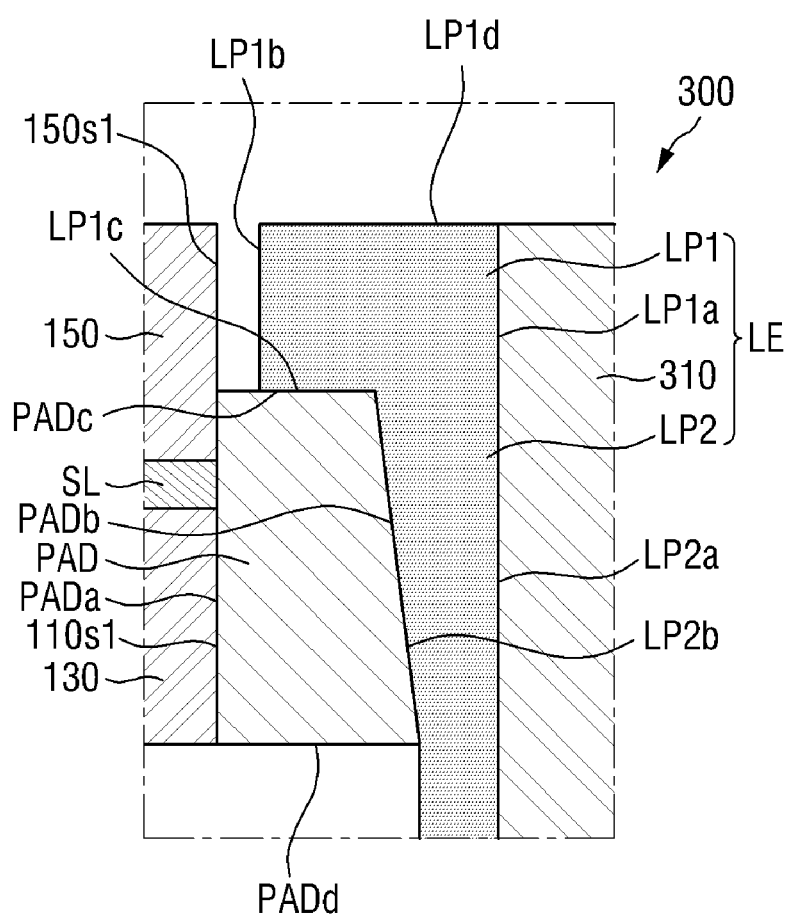
FIG. 27 is a cross-sectional view of display device according to still another exemplary embodiment.

FIG. 27 is a cross-sectional view of display device according to still another exemplary embodiment.

Referring to FIG. 27, the second side surface PADb of the signal wiring PAD and the second side surface LP2b of the second lead pattern LP2 facing the second side surface PADb according to the present exemplary embodiment are inclined, respectively. It differs from the embodiment of FIG. 4 in that PADb and LP2b are inclined. The inclinations of the second side surface PADb and the second side surface LP2b are respectively extended in a direction between an extension direction of the first side LP2a (DR3) and an extension direction of the lower surface PADd (DR2). The inclination of the second side surface PADb of the signal wiring PAD and the second side surface LP2b of the second lead pattern LP2 according to FIG. 27 can be applied to the side of the signal wiring and the side of the lead pattern that are faced with each other in the aforementioned embodiments.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel including a plurality of signal wirings disposed on a side surface, each of the signal wirings including a first surface and a second surface different from the first surface; and
a printed circuit board attached to the side surface of the display panel and including a base film and a plurality of lead wirings disposed on one surface of the base film,
wherein each of the lead wirings includes a first lead portion and a second lead portion having a thickness smaller than the first lead portion, and
wherein the first lead portion is bonded to the second surface, and the second lead portion is bonded to the first surface.

2. The display device of claim 1, wherein the display panel includes a first substrate and a second substrate facing the first substrate,
wherein the signal wirings are disposed over a side surface of the first substrate and a side surface of the second substrate, and
wherein the signal wiring includes a third surface bonded to the side surface of the first substrate and the side surface of the second substrate, and the first surface is opposite to the third surface.

3. The display device of claim 2, wherein the second lead portion includes a first surface facing the one surface of the base film and a second surface opposite to the first surface, and
wherein the first surface of the signal wiring is in contact with the second surface of the second lead portion.

4. The display device of claim 3, wherein the second surface of the signal wiring is disposed on the side surface of the second substrate and faces the second substrate from the first substrate, and
wherein the second surface of the signal wiring is in contact with the first lead portion.

5. The display device of claim 4, wherein the first lead portion includes a third surface facing the first substrate from the second substrate and the third surface of the first lead portion is in contact with the second surface of the signal wiring.

6. The display device of claim 3, wherein the second surface of the signal wiring is disposed on the side surface of the first substrate and faces the first substrate from the second substrate, and
wherein the second surface of the signal wiring is in contact with the first lead portion.

7. The display device of claim 6, wherein the first lead portion includes a third surface facing the second substrate from the first substrate, and
wherein the third surface of the first lead portion is in contact with the second surface of the signal wiring.

8. The display device of claim 3, wherein the lead wiring further includes a third lead portion having a thickness larger than the second lead portion and separated from the first lead portion with the second lead portion interposed therebetween,
wherein the second surface of the signal wiring is disposed on the side surface of the second substrate and faces the second substrate from the first substrate, and
wherein the signal wiring further includes a fourth surface which is disposed on the side surface of the first substrate, faces the first substrate from the second substrate and is opposite to the second surface.

9. The display device of claim 8, wherein the second surface of the signal wiring is in contact with the first lead portion, and
wherein the fourth surface of the signal wiring is in contact with the third lead portion.

10. The display device of claim 9, wherein the first lead portion includes a third surface facing the first substrate from the second substrate,
wherein the third surface of the first lead portion is in contact with the second surface of the signal wiring,
wherein the third lead portion includes a fourth surface facing the second substrate from the first substrate, and
wherein the fourth surface of the third lead portion is in contact with the fourth surface of the signal wiring.

11. The display device of claim 2, wherein in one of the lead wirings, the first lead portion is disposed on one side of the second lead portion in a side surface extending direction of the display panel.

12. The display device of claim 11, wherein in one of the lead wirings, the first lead portion is further disposed on the other side opposite to the one side of the second lead portion in the side surface extending direction of the display panel.

13. The display device of claim 12, wherein the first lead portion is disposed on one side of the second lead portion in a direction to the first substrate from the second substrate and on the other side opposite to the one side of the second lead portion,
wherein the second lead portion includes a lead groove surrounded by the first lead portion in a plan view, and
wherein the signal wiring is received in the lead groove.

14. The display device of claim 1, wherein the display panel includes a first substrate and a second substrate facing the first substrate,
wherein the signal wirings are disposed over a side surface of the first substrate and a side surface of the second substrate, and
wherein the signal wiring includes a first signal wiring pattern and a second signal wiring pattern having a thickness smaller than the first signal wiring pattern.

15. The display device of claim 14, wherein the first signal wiring pattern is in contact with the first lead portion and the second lead portion, and
wherein the second signal wiring pattern is in contact with the first lead portion.

16. The display device of claim 15, wherein the lead wiring further includes a third lead portion having a thickness larger than the second lead portion and separated from the first lead portion with the second lead portion interposed therebetween, and
wherein the signal wiring further includes a third signal wiring pattern having a thickness smaller than the second signal wiring pattern and separated from the second signal wiring pattern with the first signal wiring pattern interposed therebetween.

17. The display device of claim 16, wherein the first signal wiring pattern is in contact with the first lead portion and the third lead portion, and
wherein the third signal wiring pattern is in contact with the third lead portion.

18. The display device of claim 14, wherein the signal wiring further includes a third signal wiring pattern having a thickness larger than the second signal wiring pattern and separated from the first signal wiring pattern with the second signal wiring pattern interposed therebetween,
  wherein the first signal wiring pattern is in contact with the first lead portion and the second lead portion,
  wherein the second signal wiring pattern is in contact with the first lead portion, and
  wherein the third signal wiring pattern is in contact with the first lead portion and the second lead portion.

19. A display device comprising:
  a display panel including a plurality of signal wirings disposed on a side surface, each of the signal wirings including a first surface and a second surface different from the first surface; and
  a printed circuit board attached to the side surface of the display panel and including a base film and a plurality of lead wirings disposed on the base film,
  wherein each of the lead wirings includes a first region where a main lead portion is disposed on one surface of the printed circuit board facing the side surface of the display panel, and a second region where the main lead portion and a protruding lead portion protruding from the main lead portion are disposed to overlap each other,
  wherein the first region of the lead wiring is bonded to the first surface of the signal wiring, and
  wherein the second region of the lead wiring is bonded to the second surface of the signal wiring.

20. The display device of claim 19, wherein the display panel includes a display substrate and an encapsulating substrate facing the display substrate, and
  wherein the signal wirings are disposed over a side surface of the display substrate and a side surface of the encapsulating substrate.

21. A display device comprising:
  a display panel including substrate and a signal wiring disposed on a side surface of the substrate, the signal wiring including a first surface contacting the side surface of the substrate, a second surface facing the first surface, and a third surface connected with the first surface and the second surface; and
  a printed circuit including a film and a lead wiring disposed on one surface of the film,
  wherein a lead wiring includes a first lead portion and a second lead portion having a thickness smaller than the first lead portion, and
  the first lead portion contacts the second surface of the signal wiring, and the second lead portion contacts the third surface of the signal wiring.

* * * * *